(12) United States Patent
Okazaki et al.

(10) Patent No.: US 11,451,728 B2
(45) Date of Patent: Sep. 20, 2022

(54) IMAGE SENSORS AND DRIVING METHODS THEREOF

(71) Applicant: Samsung Electronics Co., Ltd., Suwon-si (KR)

(72) Inventors: Takashi Okazaki, Yokohama (JP); Mineki Taoka, Yokohama (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 85 days.

(21) Appl. No.: 17/018,265

(22) Filed: Sep. 11, 2020

(65) Prior Publication Data

US 2021/0235029 A1 Jul. 29, 2021

(30) Foreign Application Priority Data

Jan. 24, 2020 (JP) .............................. JP2020-009839

(51) Int. Cl.
 *H04N 5/359* (2011.01)
 *H04N 5/353* (2011.01)
 *H04N 5/341* (2011.01)
 *H01L 27/30* (2006.01)

(52) U.S. Cl.
 CPC ........... *H04N 5/3597* (2013.01); *H04N 5/341* (2013.01); *H04N 5/353* (2013.01); *H01L 27/307* (2013.01)

(58) Field of Classification Search
 CPC ...... H04N 5/3597; H04N 5/341; H04N 5/353; H04N 5/3745; H04N 5/3694; H04N 5/3765; H01L 27/307; H01L 27/14603
 USPC ....................................................... 348/297
 See application file for complete search history.

(56) References Cited

U.S. PATENT DOCUMENTS

| | | | |
|---|---|---|---|
| 6,847,398 B1 * | 1/2005 | Fossum | H04N 5/374 348/297 |
| 8,436,924 B2 | 5/2013 | Soya et al. | |
| 10,204,964 B1 | 2/2019 | Lee et al. | |
| 10,497,754 B2 | 12/2019 | Lee et al. | |
| 2016/0182843 A1 * | 6/2016 | Endo | H04N 5/3572 348/294 |
| 2018/0213170 A1 | 7/2018 | Segawa et al. | |

(Continued)

FOREIGN PATENT DOCUMENTS

| | | | |
|---|---|---|---|
| JP | 4700947 B2 | 6/2011 | |
| JP | 4795910 B2 | 10/2011 | |

(Continued)

*Primary Examiner* — Lin Ye
*Assistant Examiner* — Chan T Nguyen
(74) *Attorney, Agent, or Firm* — Harness, Dickey & Pierce, P.L.C.

(57) ABSTRACT

An organic photoelectric film on a substrate may perform photoelectric conversion of incident light. Pixel electrodes are arranged in a matrix form in an X-axis direction and a Y-axis direction between the substrate and the organic photoelectric film. A driving circuit may read pixel information from each pixel electrode of a pixel electrode line including a plurality of pixel electrodes arranged in the X-axis direction, and applies an on-voltage or an off-voltage to each pixel electrode 40 of the pixel electrode line. The driving circuit may scan a photoelectric conversion ON region to which the on-voltage is applied in the −Y-axis direction in synchronization with a timing of scanning a read line to which the pixel information is read in the −Y-axis direction.

17 Claims, 21 Drawing Sheets

(56) References Cited

U.S. PATENT DOCUMENTS

| | | | |
|---|---|---|---|
| 2019/0268554 A1* | 8/2019 | Kawai | H04N 5/361 |
| 2020/0052041 A1 | 2/2020 | Lee et al. | |
| 2020/0083297 A1 | 3/2020 | Joei et al. | |

FOREIGN PATENT DOCUMENTS

| | | | |
|---|---|---|---|
| JP | 4946849 B2 | 6/2012 |
| JP | 2018-093052 A | 6/2018 |
| JP | 2019-062183 A | 4/2019 |
| JP | 6566749 B2 | 8/2019 |

\* cited by examiner

IMAGE SENSORS AND DRIVING METHODS THEREOF

CROSS-REFERENCE TO RELATED APPLICATION

This application claims priority to and the benefit of Japanese Patent Application No. 2020-009839 filed in the Japan Patent Office on Jan. 24, 2020, the entire contents of which are incorporated herein by reference.

BACKGROUND

(a) Field

The described technology generally relates to image sensors and driving methods thereof.

(b) Description of the Related Art

Photoelectric conversion members, using silicon as a single material, for use in digital cameras have been developed. However, when the silicon is used as the single material in a photoelectric conversion member, a band gap associated with the photoelectric conversion member is fixed (e.g., constant) and a color filter is formed only on a surface of the photoelectric conversion member. Therefore, the photoelectric conversion member using the silicon as the single material should arrange red pixels, green pixels, and blue pixels in a surface direction to perform color imaging with a single plate.

In addition, when a higher-resolution subject is imaged by using the above-described photoelectric conversion member, luminance moiré or color moiré may occur. Therefore, it is necessary to mount an optical low-pass filter in an imaging apparatus in order to suppress the luminance moiré or color moiré. However, if the optical low-pass filter is mounted in the imaging apparatus, the resolution is lowered.

Accordingly, Japanese Patent No. 4700947 (hereinafter referred to as the "947 patent") discloses a method of forming a silicon film on which blue pixels and red pixels are arranged using a semiconductor manufacturing process and disposing an organic photoelectric conversion film absorbing a green wavelength on an upper layer of the silicon film. In such a photoelectric conversion member, since pixels absorbing the green wavelength exist over the entire surface of the photoelectric conversion member, there is theoretically no luminance moiré, and color moiré may be significantly suppressed.

However, in a case of performing green photoelectric conversion using the photoelectric conversion material described in the '947 patent, when strong light is received and then rapidly turned off, only the green pixels remain as an afterimage because the response of the organic material is slower than that of the silicon.

SUMMARY

Example embodiments may provide image sensors with a high image quality and high response characteristics, and driving methods thereof.

According to some example embodiments, an image sensor may include a substrate, an organic photoelectric film on the substrate, a plurality of pixel electrodes between the substrate and the organic photoelectric film, and a driving circuit on the substrate. The organic photoelectric film may be configured to perform photoelectric conversion of incident light. The plurality of pixel electrodes may be arranged, in a matrix form, in a first direction and a second direction intersecting the first direction. The plurality of pixel electrodes may define a plurality of pixel electrode lines. Each pixel electrode line of the plurality of pixel electrode lines may include a separate linear sequential pattern of pixel electrodes. Each linear sequential pattern may extend in the first direction. The driving circuit may be configured to read pixel information from each pixel electrode of at least one pixel electrode line among the plurality of pixel electrode lines, the at least one pixel electrode line being a read line, and apply, to one or more pixel electrode lines of the plurality of pixel electrode lines, a particular voltage that is an on-voltage associated with performing the photoelectric conversion, or an off-voltage associated with stopping the photoelectric conversion. The driving circuit may be configured to scan a photoelectric conversion ON region including a first pixel electrode line, to which the on-voltage is applied among the plurality of pixel electrode lines, in a first side of the second direction in synchronization with a timing of scanning the read line, among the plurality of pixel electrode lines from which the pixel information is read in the first side of the second direction.

The driving circuit may be configured to apply the off-voltage to a second pixel electrode line that is external to the photoelectric conversion ON region among the plurality of pixel electrode lines.

The driving circuit may be configured to apply the off-voltage to a second pixel electrode line that is spaced apart from the read line in a second side of the second direction, the second side of the second direction being opposite to the first side of the second direction.

The photoelectric conversion ON region may include two or more pixel electrode lines of the plurality of pixel electrode lines.

The photoelectric conversion ON region may include the read line and a pixel electrode line spaced apart from the read line in the first side of the second direction.

A quantity of pixel electrode lines, of the two or more pixel electrode lines, in the photoelectric conversion ON region is set based on an exposure time during which the on-voltage is applied.

The driving circuit may be configured to move the photoelectric conversion ON region by a first set of two or more pixel electrode lines in the first side of the second direction in synchronization with scanning a second set of two or more pixel electrode lines as a plurality of read lines.

The driving circuit may be configured to move the photoelectric conversion ON region by one pixel electrode line in the first side in synchronization with scanning the read line by one pixel electrode line.

The driving circuit may include a floating diffusion capacitor that is configured to accumulate carriers as the pixel information, and an exposure time during which the on-voltage is applied may be set based on a capacitance of the floating diffusion capacitor.

The exposure time may be set further based on illuminance of light incident on the organic photoelectric film.

The driving circuit may include a read circuit on each pixel electrode of the plurality of pixel electrodes, each read circuit configured to read the pixel information from a corresponding pixel electrode, and a bias circuit on each pixel electrode line of the plurality of pixel electrode lines, each bias circuit configured to apply the on-voltage or the off-voltage to each pixel electrode of a corresponding pixel electrode line.

The image sensor may further include a photoelectric film electrode on the organic photoelectric film. The bias circuit may be configured to apply the on-voltage to each pixel electrode of the corresponding pixel electrode line so that the photoelectric film electrode has a positive potential compared to each pixel electrode of the corresponding pixel electrode line, and apply the off-voltage to each pixel electrode of the corresponding pixel electrode line so that each pixel electrode of the corresponding pixel electrode line has a positive potential compared to the photoelectric film electrode.

According to some example embodiments, driving method of an image sensor, the image sensor including a substrate, an organic photoelectric film on the substrate and configured to perform photoelectric conversion of incident light, and a plurality of pixel electrode lines between the substrate and the organic photoelectric film, the plurality of pixel electrode lines arranged in a first direction, each pixel electrode line of the plurality of pixel electrode lines including a separate linear sequential pattern of pixel electrodes, each linear sequential pattern extending in a second direction intersecting the first direction, may include: scanning a pixel electrode line, of the plurality of pixel electrode lines, that is a read line, from which pixel information is read among the plurality of pixel electrode lines, in a first side of the first direction; and moving a photoelectric conversion ON region including a separate pixel electrode line, to which an on-voltage associated with performing the photoelectric conversion is applied among the pixel electrode lines, in the first side of the first direction in synchronization with a timing of scanning the read line in the first side of the first direction.

The method may further include applying an off-voltage associated with stopping the photoelectric conversion to at least one pixel electrode line that is external to the photoelectric conversion ON region among the plurality of pixel electrode lines.

The photoelectric conversion ON region may include the read line and at least one pixel electrode line spaced apart from the read line in the first side of the first direction.

A quantity of pixel electrode lines in the photoelectric conversion ON region maybe be set based on an exposure time during which the on-voltage is applied.

According to some example embodiments, an image sensor may include a substrate, an organic photoelectric film on the substrate, a plurality of pixel electrode lines between the substrate and the organic photoelectric film, and a driving circuit. The organic photoelectric film may be configured to perform photoelectric conversion of incident light. The plurality of pixel electrode lines may be arranged in a first direction. Each pixel electrode line of the plurality of pixel electrode lines may include a separate linear sequential pattern of pixel electrodes, each linear sequential pattern may extend in a second direction intersecting the first direction. The driving circuit may be configured to scan a pixel electrode line, of the plurality of pixel electrode lines, that is a read line from which pixel information is read among the plurality of pixel electrode lines in a first side of the first direction to read pixel information from one or more pixel electrodes in the read line, and move a photoelectric conversion ON region including a separate pixel electrode line, to which an on-voltage associated with performing the photoelectric conversion is applied among the plurality of pixel electrode lines, in the first side of the first direction in synchronization with a timing of scanning the read line in the first side of the first direction.

The driving circuit may be configured to apply an off-voltage associated with stopping the photoelectric conversion to at least one pixel electrode line that is external to the photoelectric conversion ON region among the plurality of pixel electrode lines.

The photoelectric conversion ON region may include the read line and at least one pixel electrode line spaced apart from the read line in the first side of the first direction.

A quantity of pixel electrode lines in the photoelectric conversion ON region may be set based on an exposure time during which the on-voltage is applied.

DETAILED DESCRIPTION

Figure 1:
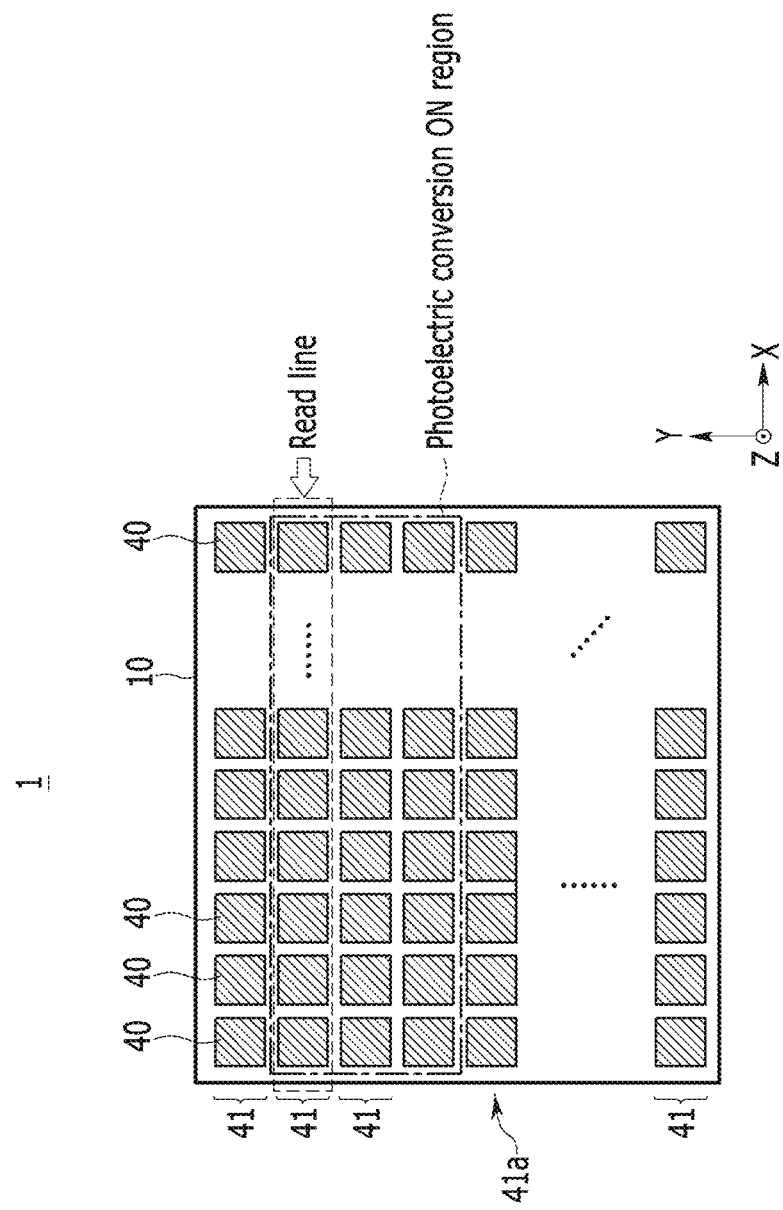
FIG. 1 is a top view showing an image sensor according to some example embodiments.

In the following detailed description, only some example embodiments of the present inventive concepts have been shown and described, simply by way of illustration. As those skilled in the art would realize, the described example embodiments may be modified in various different ways, all without departing from the spirit or scope of the present inventive concepts. Accordingly, the drawings and description are to be regarded as illustrative in nature and not restrictive. Like reference numerals designate like elements throughout the specification.

Hereinafter, an image sensor according to some example embodiments is described. A configuration of the image sensor is first described, and then an operation of the image sensor is described. In addition, an image sensor for reducing a circuit scale is described as in some example embodiments.

Configuration of Image Sensor

Figure 2:
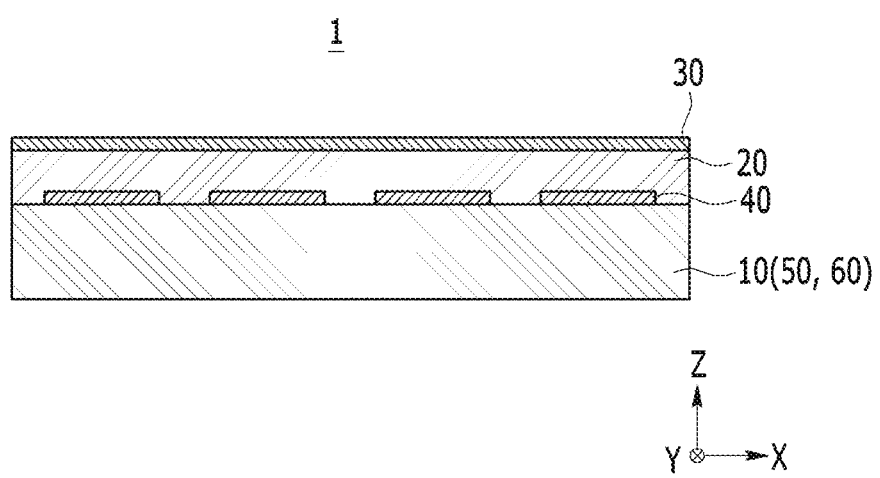
FIG. 2 is a cross-sectional view showing an image sensor according to some example embodiments.
Figure 3:
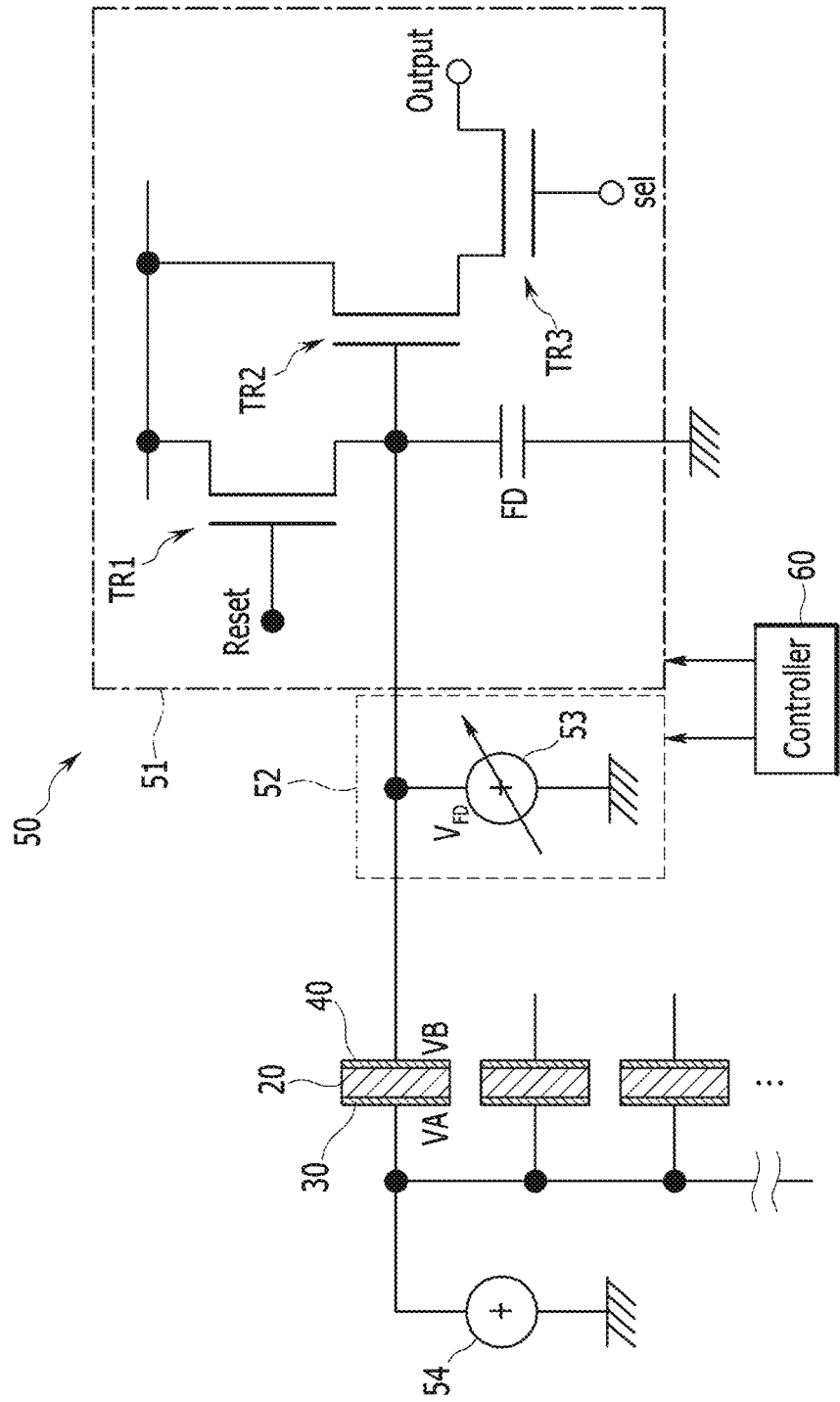
FIG. 3 is a circuit diagram showing an image sensor according to some example embodiments.

FIG. 1 is a top view showing an image sensor according to some example embodiments. FIG. 2 is a cross-sectional view showing an image sensor according to some example embodiments. FIG. 3 is a circuit diagram showing an image sensor according to some example embodiments.

As shown in FIG. 1 to FIG. 3, an image sensor 1 includes a substrate 10, an organic photoelectric film 20, a photoelectric film electrode 30, pixel electrodes 40, a driving circuit 50, and a controller 60.

FIG. 1 is a top view excluding the organic photoelectric film 20 and the photoelectric film electrode 30. Each element is described below.

Substrate

A substrate 10 may be, for example, a semiconductor substrate. In some example embodiments, the substrate 10 may be a silicon substrate including silicon. When the substrate 10 is the silicon substrate, pixels (e.g., silicon-based photodiodes) configured to perform photoelectric conversion of red light and blue light may be formed on the substrate 10. The substrate 10 is not limited to the silicon substrate, and may be a substrate including other semiconductor materials.

Organic Photoelectric Film

An organic photoelectric film 20 is formed on the substrate 10. The organic photoelectric film 20 may be a so-called beta film and may be integrally formed on the substrate 10. The organic photoelectric film 20 may include, for example, an organic semiconductor. A thickness of the organic photoelectric film 20 may be, for example, several hundred nm. The organic photoelectric film 20 performs photoelectric conversion of at least some incident light. In some example embodiments, the organic photoelectric film 20 may perform photoelectric conversion of green light. The organic photoelectric film 20 is formed between the photoelectric film electrode 30 and the plurality of pixel electrodes 40, such that the photoelectric film electrode 30 is on the organic photoelectric film 20. In some example embodiments, the photoelectric film electrode 30 may be omitted. In the organic photoelectric film 20, a portion between one pixel electrode 40 and the photoelectric film electrode 30 corresponds to a pixel.

Photoelectric Film Electrode

A photoelectric film electrode 30 is formed on the organic photoelectric film 20. The photoelectric film electrode 30 may be a so-called beta film and may be integrally formed on the organic photoelectric film 20. The photoelectric film electrode 30 faces a plurality of pixel electrodes 40 through the organic photoelectric film 20. The photoelectric film electrode 30 is common to a plurality of pixels and has the same potential. For example, a voltage $V_{OPF\_On}$ for performing photoelectric conversion may be applied to the photoelectric film electrode 30 by a power source 54. The photoelectric film electrode may be, for example, a transparent electrode. The photoelectric film electrode may include, for example, Indium Tin Oxide (ITO).

Pixel Electrode

A plurality of pixel electrodes 40 are disposed on the substrate 10 between the substrate 10 and the organic photoelectric film 20. The pixel electrode 40 may include, for example, ITO. When the silicon substrate is used as the substrate and photoelectric conversion is also performed on the silicon substrate, the pixel electrode may be a transparent electrode such as the ITO. The pixel electrode 40 may include materials other than the ITO. The pixel electrodes 40 may define separate pixels of the plurality of pixels of the image sensor. The pixel electrodes 40, organic photoelectric film 20, and photoelectric film electrode 30 may be collectively referred to as a photoelectric conversion device.

In FIG. 1, for convenience, reference numerals are attached to several pixel electrodes 40, and reference numerals of remaining pixel electrodes 40 are omitted. The plurality of pixel electrodes 40 are arranged, in a matrix form, in a first direction and a second direction intersecting the first direction on a plane parallel to an upper surface of the substrate 10.

Here, for convenience of description of the image sensor 1, an XYZ coordinate system is introduced. A direction orthogonal to the upper surface of the substrate 10 is referred to as a Z-axis direction. An upward direction is a +Z-axis direction, and a downward direction is a −Z-axis direction. A plane orthogonal to the Z axis is referred to as an XY plane. For example, the plurality of pixel electrodes 40 may be arranged, in the matrix form, in the X-axis direction (also referred to herein as a first direction) and the Y-axis direction (also referred to herein as a second direction intersecting the first direction) on the upper surface of the substrate 10. The upward and downward directions shown in the XYZ coordinate system are for explanatory convenience and do not indicate a direction in which each element of the image sensor 1 is actually arranged.

The plurality of pixel electrodes 40 may be arranged at a pitch of, for example, 1-2 µm. The pixel electrode 40 may be provided in each pixel. Each pixel electrode 40 may define a separate pixel of the image sensor 1, where each pixel includes a separate pixel electrode 40, and a portion of the organic photoelectric film 20 and photoelectric film electrode 30 that overlap the pixel electrode 40 in the Z direction. The pixel electrode 40 has a function of applying a photoelectric conversion voltage to the organic photoelectric film 20 and reading pixel information from each pixel. The pixel information may be, for example, a carrier such as electric charge. The carrier generated in the organic photoelectric film 20 is output through the pixel electrode 40 by the driving circuit 50.

As shown in FIG. 1, a pixel electrode line 41 includes a plurality of pixel electrodes 40 lined up in the X-axis direction. Restated, a linear sequential pattern of pixel electrodes 40 may define a pixel electrode line 41, such that the plurality of pixel electrode 40 define a plurality of pixel electrode lines 41, where each pixel electrode line includes a separate linear sequential pattern of pixel electrodes extending in the X-axis direction (e.g., first direction), where the separate pixel electrodes 40 (e.g., separate linear sequential patterns of pixel electrodes 40) may extending in parallel to each other, spaced apart from each other in the Y-axis direction (e.g., second direction) A plurality of pixel electrode lines 41 are lined up in the Y-axis direction. The number (e.g., quantity) of pixel electrode lines 41 lined up in the Y-axis direction is referred to as a line number. In FIG. 1, for convenience, reference numerals are attached to several pixel electrode lines 41, and reference numerals of remaining pixel electrode lines 41 are omitted.

When reading the pixel information, the pixel information is read from each pixel electrode 40 of the pixel electrode line 41. The pixel information may be read from, for example, one line of pixel electrode lines 41. The pixel electrode line 41 for the reading pixel information is referred to as a read line. In FIG. 1, the read line is surrounded by a dotted line. The image sensor 1 according to some example embodiments scans the read line by one line in the −Y-axis direction.

In a case of performing photoelectric conversion using the organic photoelectric film 20, an on-voltage for performing the photoelectric conversion may be applied to each pixel electrode 40, for example, in a particular (or, alternatively, predetermined) number of pixel electrode lines 41 lined up (e.g., aligned) in the Y-axis direction. The on-voltage, when applied to a pixel electrode 40, may cause the pixel electrode 40 to perform photoelectric conversion of incident line, and therefore applying an on-voltage for (e.g., associated with) performing photoelectric conversion to a pixel electrode line 41 may cause one or more, or all pixel electrodes 40 in the pixel electrode line 41 to perform photoelectric conversion of incident light. As referred to herein, photoelectric conversion by a pixel electrode may include generating an output signal based on a photoelectric film or layer of the pixel electrode performing photoelectric conversion of incident light. In FIG. 1, three pixel electrode lines 41 is surrounded by dash-dotted lines and shown as the particular (or, alternatively, predetermined) number of pixel electrode lines 41 to which the on-voltage is applied.

The particular (or, alternatively, predetermined) number (e.g., range) of pixel electrode lines 41 to which the on-voltage is applied is referred to as a "photoelectric conversion ON region". The photoelectric conversion ON region may include a plurality (e.g., two or more) of pixel electrode lines 41 which may be a limited portion of the plurality of pixel electrode lines 41 of the image sensor 1. In some example embodiments, the photoelectric conversion ON region may include a read line and at least one pixel electrode line 41 arranged in the −Y-axis direction from the read line (e.g., at least one pixel electrode line 41 that is spaced apart from the read line in the first side of the second direction). The −Y-axis direction may be referred to herein as a "first side" of a second direction, such that an operation proceeding in the −Y-axis direction may be referred to as proceeding "in a first side of the second direction," and the +Y-axis direction may be referred to herein as a "second side" of the second direction, such that an operation proceeding in the +Y-axis direction may be referred to as proceeding "in a second side of the second direction," where the second side of the second direction is opposite to the first side of the second direction. In some example embodiments, the pixel electrode line 41 included in the photoelectric conversion ON region may be continuous to the read line. The organic photoelectric film 20 formed between the pixel electrode 40 to which the on-voltage is applied in the photoelectric conversion ON region and the photoelectric film electrode 30 performs the photoelectric conversion (e.g., based on the on-voltage being applied to said pixel electrode 40).

The image sensor 1 according to some example embodiments scans the photoelectric conversion ON region in the −Y-axis direction (e.g., downwards in the Y direction shown in FIG. 1, also referred to as being in the first side of the second direction). In some example embodiments, the photoelectric conversion ON region may be scanned in the −Y-axis direction (e.g., in the first side of the second direction) in synchronization with the timing at which the read line is scanned in the −Y-axis direction. In some example embodiments, the image sensor 1 may scan the pixel electrode line 41 performing the photoelectric conversion in synchronization with the timing at which the pixel information is read.

In some example embodiments, when the photoelectric conversion is stopped in the organic photoelectric film 20, an off-voltage for stopping photoelectric conversion is applied to each pixel electrode 40 of the pixel electrode line 41. In some example embodiments, the application of the off-voltage to a pixel electrode 40 causes photoelectric conversion by the pixel electrode 40 to be stopped, such that applying an off voltage for stopping (e.g., associated with stopping) the photoelectric conversion to a pixel electrode line 41 causes photoelectric conversion by one or more, or all, pixel electrodes 40 in the pixel electrode line 41 to stop photoelectric conversion of incident light. In FIG. 1, the off-voltage is applied to the pixel electrode lines 41 that are not surrounded by the dash-dotted lines. That is, the off-voltage is applied to the pixel electrode lines 41 other than (e.g., external to) the photoelectric conversion ON region. For example, the off-voltage may be applied to the pixel electrode lines 41 arranged in the Y-axis direction from the read line (e.g., spaced apart from the read lines in the second side of the second direction, which is shown to be upwards from the read line in FIG. 1). The organic photoelectric film 20 between the pixel electrode 40 to which the off-voltage is and the photoelectric film electrode 30 applied stops the photoelectric conversion (e.g., based on the off-voltage being applied to the pixel electrode 40).

Driving Circuit

A driving circuit 50 is formed on the substrate 10. The driving circuit 50 reads pixel information from each pixel electrode 40 of one or more pixel electrode lines 41. For example, the driving circuit 50 may scan a pixel electrode line 41 that is a read line for reading (e.g., to read) pixel information from each pixel electrode 40 in the −Y-axis direction, and read each pixel information from the read line.

The driving circuit 50 may apply a particular voltage that is an on-voltage for (e.g., associated with) performing photoelectric conversion, or a particular voltage that is an off-voltage for e.g., associated with) stopping the photoelectric conversion, to each pixel electrode 40 of one or more pixel electrode lines 41. In some example embodiments, the driving circuit 50 may apply the on-voltage to one or more pixel electrode lines 41 of the photoelectric conversion ON region (e.g., one or more first pixel electrode lines 41) and the off-voltage to one or more pixel electrode lines 41 other than (e.g., external to) the photoelectric conversion ON region (e.g., one or more second pixel electrode lines 41).

In some example embodiments, the driving circuit 50 may scan the photoelectric conversion ON region in the −Y-axis direction (e.g., in a first side of the second direction) in synchronization with the timing of (e.g., concurrently with) scanning the read line in the −Y-axis direction in the plurality of pixel electrode lines 41. Therefore, the driving circuit 50 may apply the off-voltage to the pixel electrode line 41 arranged in the +Y-axis direction from the read line (e.g., spaced apart from the read line in the second side of the second direction).

As shown in FIG. 3, the organic photoelectric film 20 is disposed between the photoelectric film electrode 30 and the pixel electrode 40. A voltage VA is applied to the photoelectric film electrode 30. A voltage VB is applied to the pixel electrode 40. In the image sensor 1 including the organic photoelectric film 20, hole-reading may be performed. Therefore, when the photoelectric conversion is performed, the voltage VA of the photoelectric film electrode 30 has a positive potential compared to the voltage VB of the pixel electrode 40.

In some example embodiments, the voltage of the photoelectric film electrode 30 may have the positive potential compared to the voltage of the pixel electrode 40, so as to perform the photoelectric conversion for a Tsec time in each pixel electrode line 41. A time Tsec during which the photoelectric conversion is performed, that is, a time Tsec during which an on-voltage for performing the photoelectric conversion is applied to the pixel electrode 40 is referred to as an exposure time. In some example embodiments, the exposure time Tsec may be set based on a capacitance of a floating diffusion capacitor that accumulates carriers as pixel information, as described below. An off-voltage for stopping the photoelectric conversion is applied to the pixel electrode 40 during a period other than the exposure time Tsec.

The drive circuit 50 includes a read circuit 51 and a bias circuit 52. The read circuit 51 is formed on each pixel electrode 40. The read circuit 51 reads pixel information from each pixel electrode 40. In some example embodiments, the drive circuit 50 includes a read circuit 51 on one or more, or all pixel electrodes 40 of the image sensor 1, and the read circuit 51 may read pixel information from one or more pixel electrodes 40 on which the read circuit 51 is formed. In some example embodiments, the drive circuit 50 includes separate read circuits 51 on separate, respective pixel electrodes 40, and each read circuit 51 may read pixel information from the corresponding pixel electrode 40 on which the read circuit 51 is formed. The read circuit 51 may include, for example, a floating diffusion capacitor FD, a transistor TR1, a transistor TR2, and a transistor TR3. Transistors TR1, TR2 and TR3 may be, for example, field effect transistors (FETs).

A first end of the floating diffusion capacitor FD is connected to the pixel electrode 40. A second end of the floating diffusion capacitor FD is grounded. The floating diffusion capacitor FD may accumulate carriers formed in the organic photoelectric film 20 of the pixel as pixel information.

A first end of the transistor TR1 is connected to a power supply. A second end of the transistor TR1 is connected to the first end of the floating diffusion capacitor FD. The transistor TR1 is turned on during non-exposure, that is, while the photoelectric conversion is stopped. Therefore, the carriers accumulated in the floating diffusion capacitor FD may be led to the power supply by the bias circuit 52 during the non-exposure. During exposure, the transistor TR1 is turned off so that carriers formed in the organic photoelectric film 20 are accumulated in the floating diffusion capacitor FD.

Immediately after transition from the exposure to the non-exposure, the floating diffusion capacity portion FD is emptied by leading carriers accumulated in the floating diffusion capacitor FD during the exposure to the power source through the transistor TR1. Then, the transistor TR1 is turned off so that the exposure is performed. Accordingly, the transistor TR1 has a function of a reset transistor.

A first end of the transistor TR2 is connected to the power supply. A second end of the transistor TR2 is connected to a first end of the transistor TR3. A gate of the transistor TR2 is connected to the first end of the floating diffusion capacitor FD. Therefore, a signal can be output according to the charges formed by photoelectric conversion during the exposure. Transistor TR2 has a function of an amplifying transistor.

The first end of the transistor TR3 is connected to the second end of the transistor TR2. A second end of transistor TR3 is connected to an output terminal. Therefore, pixel information can be obtained at the output terminal by turning on the transistor TR3. The transistor TR3 has a function of a select transistor.

The bias circuit 52 is formed in each pixel electrode line 41. In some example embodiments, separate bias circuits 52 may be formed in separate, respective pixel electrode lines 41, or a bias circuit 52 may be formed in one or more, or all pixel electrode lines 41 of the image sensor 1. The bias circuit 52 may include, for example, a variable voltage power supply 53. A first end of the variable voltage power supply 53 is connected to each pixel electrode 40 of the pixel electrode line 41. A second end of the variable voltage power supply 53 is grounded. The bias circuit 52 applies an on-voltage for performing photoelectric conversion and an off-voltage for stopping the photoelectric conversion to the pixel electrode 40 of each pixel electrode line 41. Where a bias circuit 52 is formed in one or more pixel electrode lines 41, the bias circuit 52 may apply the on-voltage or the off-voltage to each pixel electrode of the one or more pixel electrode line 41 on which the bias circuit 52 is formed. Where separate bias circuits 52 are formed in separate, respective pixel electrode lines 41, each bias circuit 52 may apply the on-voltage or the off-voltage to each pixel electrode of the corresponding pixel electrode line 41 on which the bias circuit 52 is formed.

In some example embodiments, the bias circuit 52 may apply the on-voltage to the pixel electrode 40 so that the photoelectric film electrode 30 can have a positive potential compared to the pixel electrode 40. The bias circuit 52 may apply the off-voltage to the pixel electrode 40 so that the pixel electrode 40 can have a positive potential compared to the photoelectric film electrode 30. As described above, the driving circuit 50 may include the bias circuit 52 as a voltage application mechanism for turning on and turning off the photoelectric conversion function of the organic photoelectric film 20 in each pixel electrode line 41. Where the driving circuit 50 includes a bias circuit 52 on each of the pixel electrode lines 41, the bias circuit 52 may be configured to apply the on-voltage to each pixel electrode 40 of one or more pixel electrode lines 41 so that the photoelectric film electrode 30 has a positive potential compared to each pixel electrode 40 of the one or more pixel electrode lines 41, and apply the off-voltage to each pixel electrode 40 of the one or more pixel electrode lines 41 so that each pixel electrode 40 of the one or more pixel electrode lines 41 has a positive potential compared to the photoelectric film electrode 30.

Where the driving circuit 50 includes a separate bias circuit 52 on each of the pixel electrode lines 41, each bias circuit 52 may be configured to apply the on-voltage to each pixel electrode 40 of a corresponding pixel electrode line 41 on which the bias circuit 52 is formed so that the photoelectric film electrode 30 has a positive potential compared to each pixel electrode 40 of the corresponding pixel electrode line 41, and apply the off-voltage to each pixel electrode 40 of the corresponding pixel electrode line 41 so that each pixel electrode 40 of the corresponding pixel electrode line 41 has a positive potential compared to the photoelectric film electrode 30.

Figure 4:
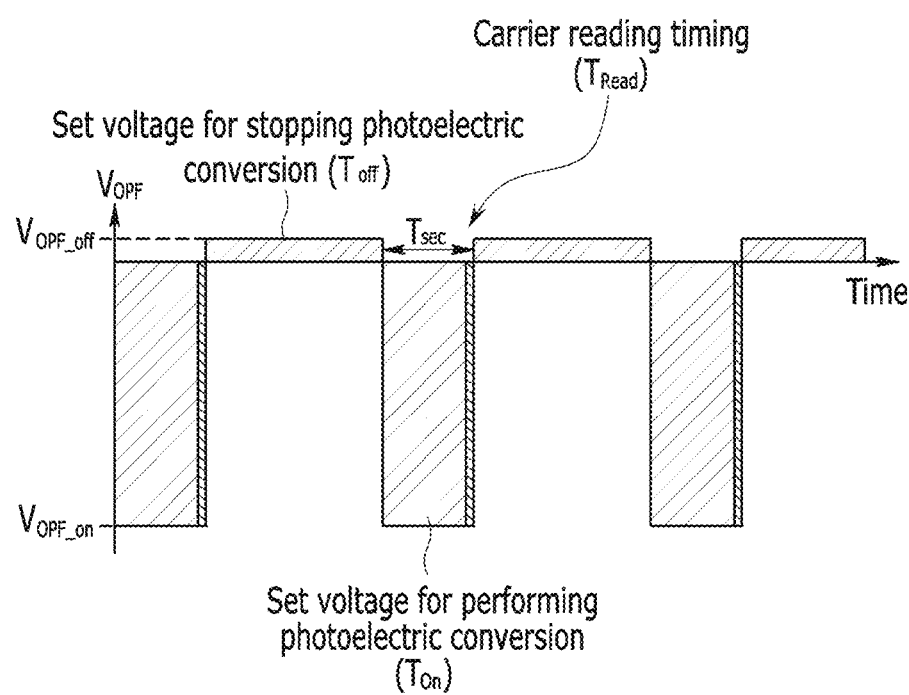
FIG. 4 is a graph showing a driving pattern for applying an on-voltage and an off-voltage to an organic photoelectric film in an image sensor according to some example embodiments, wherein a horizontal axis represents a time, and a vertical axis represents a voltage.
Figure 5:
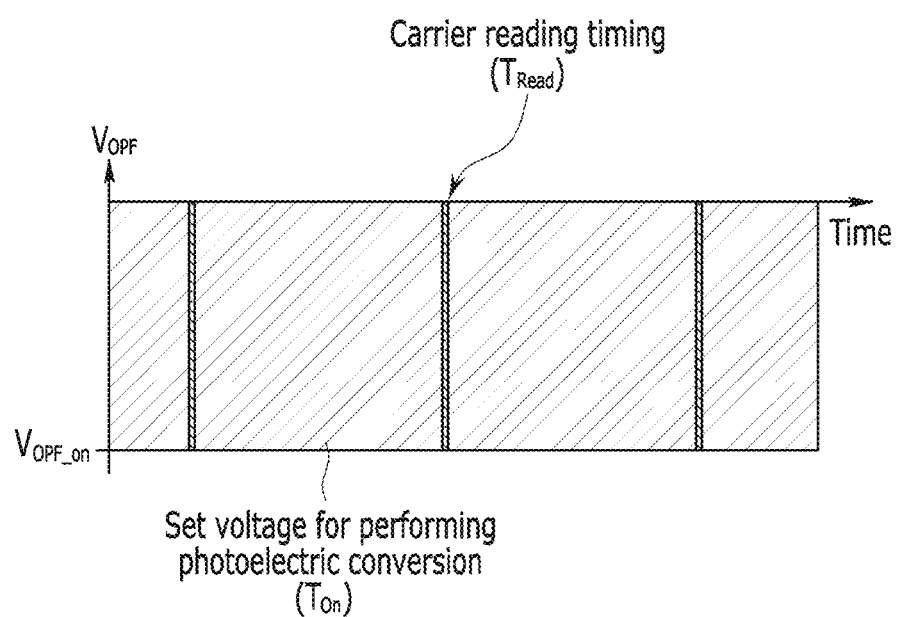
FIG. 5 is a graph showing a driving pattern for applying an on-voltage to an organic photoelectric film in an image sensor according to a comparative example wherein a horizontal axis represents a time, and a vertical axis represents a voltage.

FIG. 4 is a graph showing a driving pattern for applying an on-voltage and an off-voltage to an organic photoelectric film in an image sensor according to some example embodiments, wherein a horizontal axis represents a time, and a vertical axis represents a voltage. FIG. 5 is a graph showing a driving pattern for applying an on-voltage to an organic photoelectric film in an image sensor according to the comparative example wherein a horizontal axis represents a time, and a vertical axis represents a voltage.

As shown in FIG. 4, a $V_{OPF\_On}$ voltage is a voltage at which an organic photoelectric film 20 can efficiently perform photoelectric conversion, and a $V_{OPF\_Off}$ voltage is a voltage at which the photoelectric conversion of the organic photoelectric film 20 stops. A voltage polarity of FIG. 4 is shown based on a forward direction during a diode operation.

The organic photoelectric film 20 promotes the photoelectric conversion while a reverse electric field is applied. The organic photoelectric film 20 may have a similar photoelectric conversion function as a solar cell, and photoelectric conversion may occur even when an electric field is not applied. Accordingly, the photoelectric conversion is stopped by applying a voltage opposite to a voltage of a normal operation, that is, a forward voltage of the diode. Therefore, in some example embodiments, voltage polarities of the VOPF_On voltage and the $V_{OPF\_Off}$ voltage may be different.

An exposure time Tsec represents a time during which the on-voltage is applied to each pixel electrode line 41. In some example embodiments, the exposure time Tsec may be set based on a capacitance of the floating diffusion capacitor FD. In some example embodiments, the exposure time Tsec may be set based on illuminance (or an amount) of light irradiated to (e.g., incident on) the organic photoelectric film 20. For example, the exposure time Tsec may be calculated based on a time and the amount of light until the floating diffusion capacitor FD accumulating carriers formed in the organic photoelectric film 20 reaches saturation. In some example embodiments, the exposure time Tsec may be inversely proportional to sensitivity E of an image sensor 1, brightness F of a lens, and the amount of light S of the image sensor 1, and may be proportional to the capacitance C of the floating diffusion capacitor FD. Here, k is a constant having a constant value.

$$Tsec = k \times C \div (F \times E \times S) \quad \text{Equation 1}$$

When the image sensor 1 according to some example embodiments performs the exposure and the photoelectric conversion in, a voltage $V_{FD}$ output from the bias circuit 52 is zero. Accordingly, the voltage $V_{OPF\_On}$ of the power source 54 is applied to the organic photoelectric film 20 to perform the photoelectric conversion during a time $T_{On}$. When the photoelectric conversion is not performed, a voltage corresponding to the $V_{OPF\_Off}$ voltage is applied to the organic photoelectric film 20 during a time $T_{Off}$. In some example embodiments, a positive voltage corresponding to an absolute value of the $V_{OPF\_On}$ voltage may be applied to the photoelectric film electrode 30. Therefore, in order to apply the $V_{OPF\_Off}$ voltage, which is the forward voltage, to the organic photoelectric film 20, the voltage $V_{FD}$ output by the bias circuit 52 may be set to $(V_{OPF\_Off} + V_{OPF\_On})$ voltage.

In a period in which no photoelectric conversion is performed, the forward voltage is applied to the organic photoelectric film 20, so that a relatively large dark current flows. Accordingly, the transistor TR1 may be turned on to send this current to the power supply.

As shown in FIG. 5, in a comparative example, a constant voltage $V_{OPF\_On}$ is applied regardless of the timing of scanning the read line in the −Y-axis direction. Therefore, the photoelectric conversion is performed even in a period not required for exposure. The carriers generated by the photoelectric conversion in the period not required for exposure is generally led to the power source through the transistor TR1. However, a reaction rate of the organic photoelectric film 20 is slower than single crystals such as silicon. Therefore, the carriers remain in the organic photoelectric film 20 and are output as additional carriers when carriers are read. Therefore, the carriers remaining in the organic photoelectric film 20 adversely affect the image quality of the image sensor 1. Specifically, they appear in a form of blurring or an afterimage in a moving image.

Accordingly, in some example embodiments, the off-voltage for stopping the photoelectric conversion may be applied to the organic photoelectric film 20 in a period other than the exposure time Tsec. Therefore, since carriers are suppressed from being formed on the organic photoelectric film 20 in the period other than the exposure time Tsec, it is possible to prevent the carriers from remaining in the organic photoelectric film 20 and being output as additional carriers when carriers of the pixel are read. As a result, a moving image with little afterimage or blurring can be imaged.

Controller

A controller 60 controls an operation of a driving circuit 50. In some example embodiments, the controller 60 may include a timing controller, and control the driving circuit 50 to read pixel information from each pixel electrode 40 of a pixel electrode line 41 at a particular (or, alternatively, predetermined) timing, and apply an on-voltage or off-voltage to each pixel electrode 40 of the pixel electrode line 41. Accordingly, functionality of the driving circuit 50 as described herein may be implemented based on the controller 60 controlling the driving circuit 50.

The controller 60 may include, may be included in, and/or may be implemented by processing circuitry such as hardware including logic circuits, a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC) a programmable logic unit, a microprocessor, or an application-specific integrated circuit (ASIC). In some example embodiments, the processing circuitry may include a non-transitory computer readable storage device (e.g., a memory), for example a solid state drive (SSD), or the like, storing a program of instructions, and a processor (e.g., a CPU) configured to execute the program of instructions to implement the functionality of and/or methods performed by some or all of the controller 60 and/or any portions of the image sensor 1 (e.g., the driving circuit 50).

Operation of Image Sensor

Figure 6:
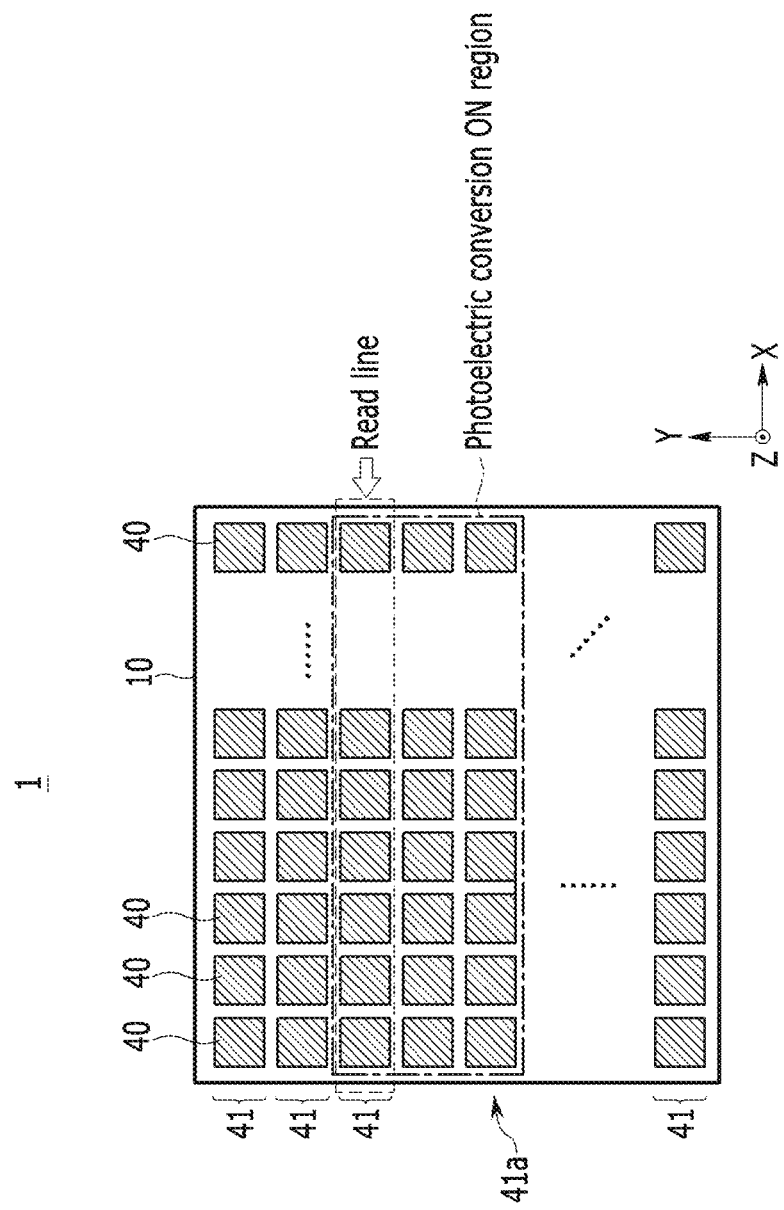
FIG. 6 is a diagram showing an operation of an image sensor according to some example embodiments.
Figure 7:
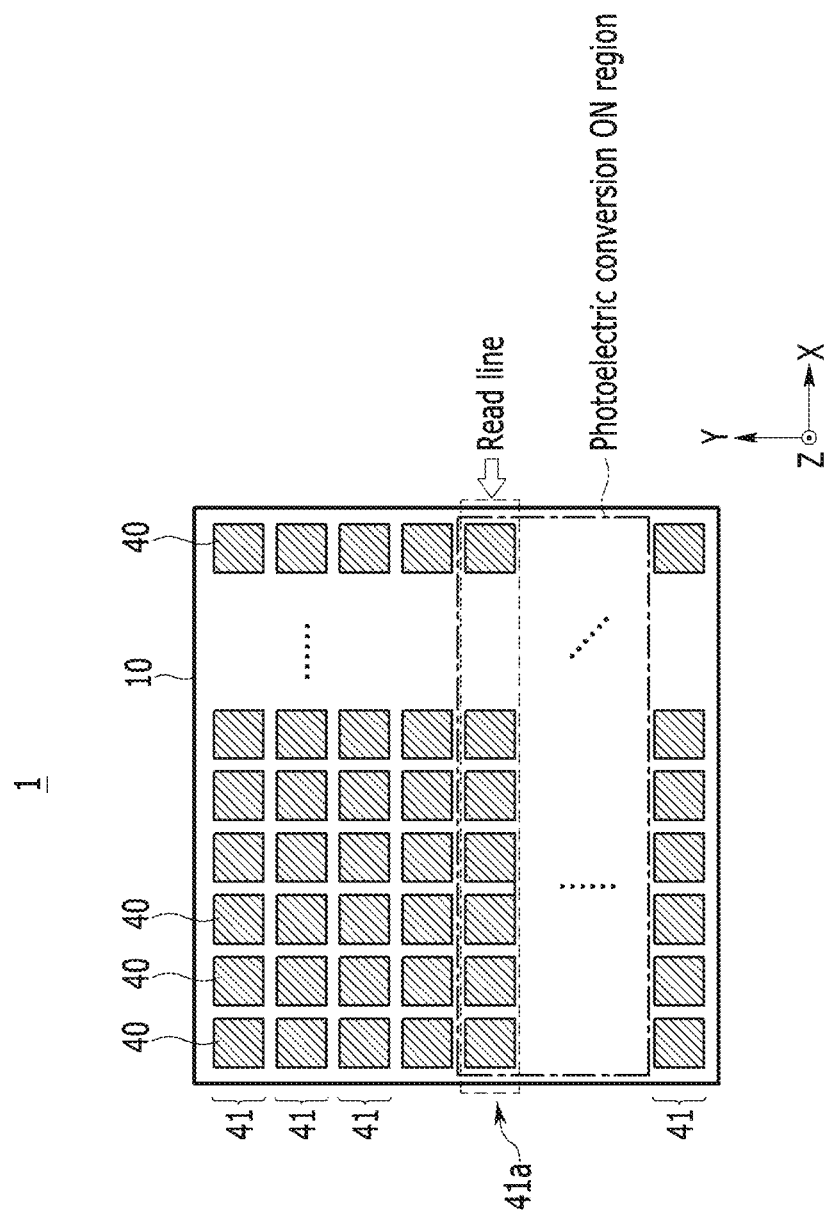
FIG. 7 is a diagram showing an operation of an image sensor according to some example embodiments.
Figure 8:
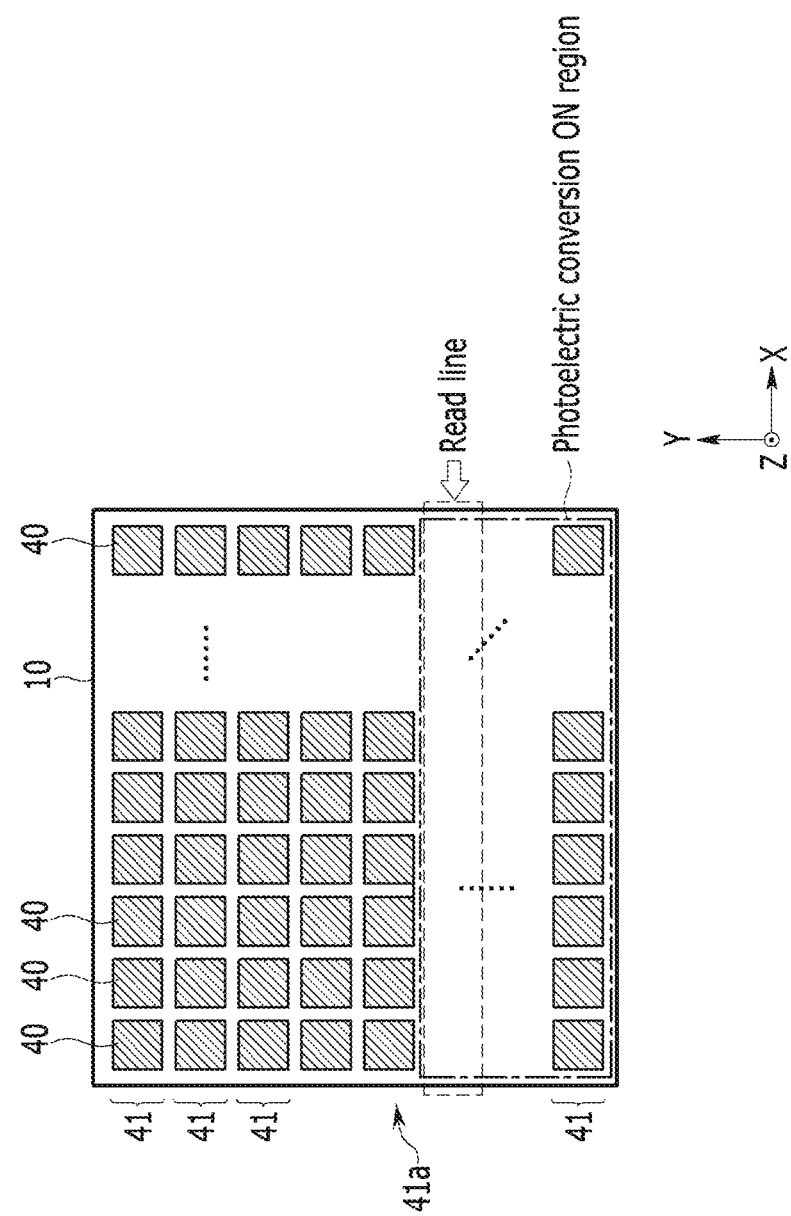
FIG. 8 is a diagram showing an operation of an image sensor according to some example embodiments.

Next, an operation of an image sensor 1 according to some example embodiments is described. FIG. 6, FIG. 7 and FIG. 8 are diagrams showing an operation of an image sensor according to some example embodiments. An image sensor 1 according to some example embodiments includes a pixel electrode line 41 to which an on-voltage is applied and a pixel electrode line 41 to which an off-voltage is applied during an operation process. A photoelectric conversion ON region including the pixel electrode line 41 to which the on-voltage is applied may be moved to scroll in a −Y-axis direction (e.g., in a first side of the second direction) in synchronization with scanning of a read line in the −Y-axis direction. Therefore, the operation of the image sensor 1 is described based on a specific pixel electrode line 41a (the fifth line from the top) shown in FIG. 1, FIG. 6, FIG. 7, and FIG. 8.

As shown in FIG. 1 and FIG. 4, in a $T_{Off}$ time, the pixel electrode line 41a is not included in the photoelectric conversion ON region. Therefore, a bias circuit (52 of FIG. 3) applies a voltage of $V_{FD}(=V_{OPF\_Off}-V_{OPF\_On})$ to the pixel electrode line 41a so that the $V_{OPF\_Off}$ voltage is applied to an organic photoelectric film 20 corresponding to the pixel electrode line 41a.

Next, as shown in FIG. 6 and FIG. 4, in a $T_{On}$ time, a driving circuit (50 of FIG. 3) scans the read line by one line in the −Y-axis direction to read pixel information from a pixel electrode 40. The driving circuit 50 scans the photoelectric conversion ON region by one line in the −Y-axis direction in synchronization with the scanning of the read line. Then, the pixel electrode line 41a is included in the photoelectric conversion ON region. Therefore, the bias circuit 52 applies the on-voltage to the pixel electrode line 41a so that the $V_{OPF\_On}$ voltage is applied to the organic photoelectric film 20 corresponding to the pixel electrode line 41a. In some example embodiments, the bias circuit 52 may apply $V_{FD}(=0)$ voltage as the on-voltage.

Next, as shown in FIG. 7 and FIG. 4, at a $T_{Read}$ time, the driving circuit 50 scans the read line by one line in the −Y-axis direction to read pixel information from the pixel electrode line 41a. In some example embodiments, a gate of a transistor (TR3 of FIG. 3) corresponding to each pixel electrode 40 of the pixel electrode line 41a may be turned on, so that the pixel information can be read through the pixel electrode 40. At this point, each pixel of the pixel electrode line 41a needs to complete the required exposure. Therefore, as shown in FIG. 6, the driving circuit 50 performs photoelectric conversion on pixel electrode lines 41 arranged in the −Y-axis direction from the read line. For example, the on-voltage may be applied to the two pixel electrode lines 41 arranged in the −Y-axis direction from the read line. That is, the photoelectric conversion ON region may include the read line and the two pixel electrode lines 41 arranged in the −Y-axis direction from the read line.

A read period of each pixel electrode line 41 is much shorter than the exposure time. The exposure time may be about 0.1-30 msec. Therefore, as described above, the exposure is performed before the read period is reached. In some example embodiments, the photoelectric conversion may be performed over a plurality of pixel electrode lines arranged in the −Y-axis direction, which is a scanning direction, from the read line.

In some example embodiments, the line number L corresponding to the exposure time Tsec may be determined as in Equation 2 depending on a frame rate F, the line number Lf of an entire screen and the exposure time Tsec.

$$L = Tsec \times F \times Lf \qquad \text{Equation 2}$$

As such, the line number L (e.g., quantity) of the pixel electrode lines 41 to which the on-voltage is applied, that is, the line number L (e.g., quantity) of pixel electrode lines 41 included in the photoelectric conversion ON region may be set based on the exposure time Tsec during which the on-voltage is applied (e.g., the exposure time Tsec during which the on-voltage is applied to the pixel electrode 40 of the pixel electrode line 41).

Next, as shown in FIG. 8 and FIG. 4, the pixel electrode line 41a is out of the photoelectric conversion ON region. In some example embodiments, the pixel electrode line 41a may be located in the Y-axis direction from the read line. Therefore, in some example embodiments, the bias circuit 52 may apply a $V_{FD}(=V_{OPF\_Off}-V_{OPF\_On})$ voltage to the pixel electrode line 41a so that the $V_{OPF\_Off}$ voltage can be applied to the organic photoelectric film 20 corresponding to the pixel electrode line 41a. As described above, the driving circuit 50 applies the off-voltage to the pixel electrode line 41 arranged in a +Y-axis direction from the pixel electrode line 41 from which the pixel information is read.

Figure 9:
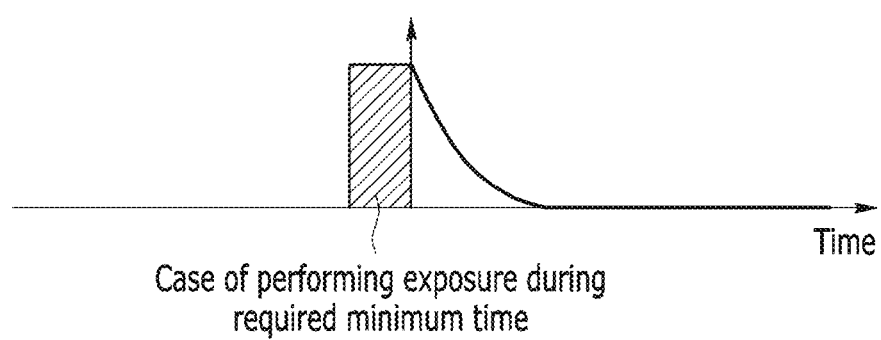
FIG. 9 is a graph showing an exposure time of light and change of residual carriers in an organic photoelectric film in an image sensor according to some example embodiments, wherein a horizontal axis represents a time, and a vertical axis represents a remaining amount of carriers.
Figure 10:
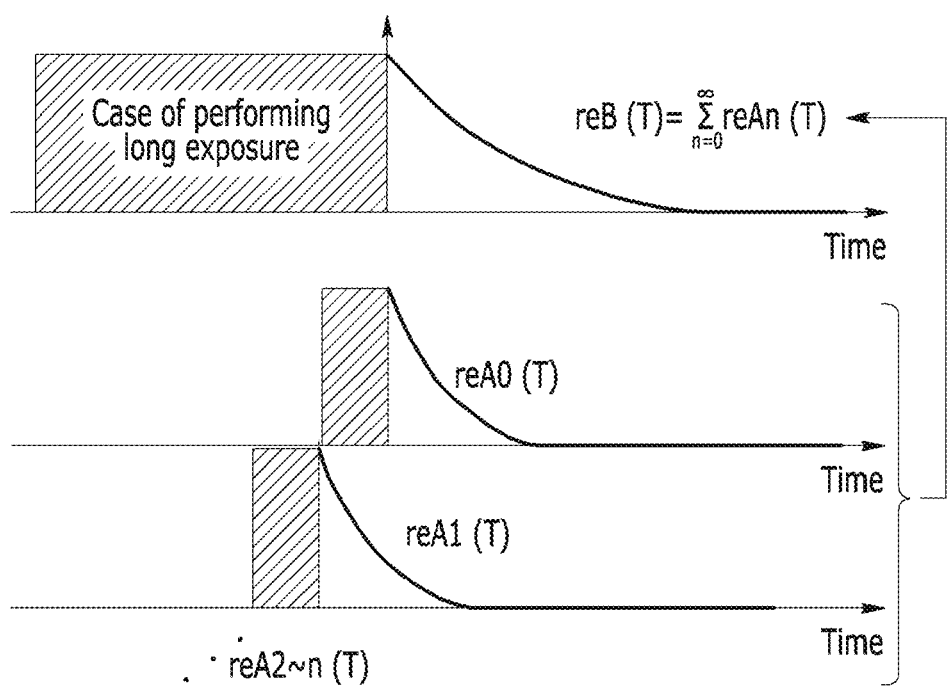
FIG. 10 is a graph showing an exposure time of light and change of residual carriers in an organic photoelectric film in an image sensor according to a comparative example, wherein a horizontal axis represents a time, and a vertical axis represents a remaining amount of carriers.

FIG. 9 is a graph showing an exposure time of light and change of residual carriers in an organic photoelectric film 20 in an image sensor according to some example embodiments, wherein a horizontal axis represents a time, and a vertical axis represents a remaining amount of carriers. FIG. 10 is a graph showing an exposure time of light and change of residual carriers in an organic photoelectric film 20 in an image sensor according to a comparative example, wherein a horizontal axis represents a time, and a vertical axis represents a remaining amount of carriers.

As shown in FIG. 9 and FIG. 10, response in an organic photoelectric film 20 is slower than a single crystal semiconductor such as silicon. Therefore, carriers generated as a result of photoelectric conversion are not immediately output.

The non-output carriers remain as residual carriers. The residual carriers decrease with time. These appear in a form of residual carriers when the light irradiated to the organic photoelectric film 20 is turned off. In some example embodiments shown in FIG. 9, the exposure is performed for a required minimum time. That is, the exposure is performed for an exposure time Tsec that is set based on illuminance or a capacitance of the floating diffusion capacitor FD. Accordingly, reduction of residual carriers is faster than the comparative example.

In some example embodiments, in the comparative example shown in FIG. 10, the exposure time is longer than that in some example embodiments, including the example embodiments shown in FIG. 9. For example, a reduction behavior of the residual carriers in the comparative example reB(T) may correspond to a combination of a plurality of reduction behaviors reAi(T) (i=0, 1, . . . , n) for the residual carriers in some example embodiments. Therefore, the residual carriers when the irradiated light is turned off in the comparative example are more than the residual carriers when the light is turned off in some example embodiments. Accordingly, a time during which the residual carriers are output also increases.

Such residual carriers appear as an afterimage or blurriness in an image. Therefore, it is required that the residual carriers be as small as possible. In some example embodiments, an on-voltage for performing photoelectric conversion and an off-voltage for stopping photoelectric conversion are applied to the organic photoelectric film 20 in synchronization with scanning of the read line. Therefore, the residual carriers can be reduced because the exposure is performed for a required time.

In addition, in the organic photoelectric film 20, the higher the brightness is, the more the residual carriers are. The brightness and the exposure time have a positive correlation with the number of generated carriers. Therefore, in imaging in a dark place, the residual carriers can be reduced by long exposure due to low brightness. In some example embodiments, although many residual carriers generate due to high brightness in imaging in a bright place, the residual carriers can be reduced by short exposure.

Since the photoelectric conversion is always performed in the image sensor according to the comparative example, the on-voltage is always applied to the organic photoelectric film 20. Therefore, it is difficult to perform the short exposure due to its structure. In some example embodiments, since the image sensor 1 according to some example embodiments can realize the short exposure as described above, it is possible to improve an image quality and response characteristics in imaging in the high brightness.

Table 1 shows the line number corresponding to the exposure time Tsec calculated based on Equation 2 in the image sensor according to some example embodiments.

As shown in Table 1, in a sunlight scene at 10 am on a cloudy day, the illuminance, the exposure time Tsec, and the line number at 60 fps are 25000 1×, 80 µs, and 10 lines, respectively. In the sunlight scene at noon on the cloudy day, the illuminance, the exposure time Tsec, and the line number at 60 fps are 32000 1×, 63 µs, and 8 lines, respectively. In the sunlight scene at 3 pm on a sunny day, the illuminance, the exposure time Tsec, and the line number at 60 fps are 35000 1×, 57 µs, and 7 lines, respectively. In the sunlight scene at 10 am on the sunny day, the illuminance, the exposure time Tsec, and the line number at 60 fps are 65000 1×, 31 µs, and 4 lines, respectively. In the sunlight scene at noon on the sunny day, the illuminance, the exposure time Tsec, and the line number at 60 fps are 100000 1×, 20 µs, and 3 lines, respectively. In a scene of a snowy mountain, the illuminance, the exposure time Tsec, and the line number at 60 fps are 200000 1×, 10 µs, and 2 lines, respectively.

TABLE 1

| Scene | Illuminance (lx) | Exposure time Tsec (µs) | Line number L at 60 fps (12 Mpix image sensor) |
|---|---|---|---|
| Cloudy day, 10am, sunlight | 25,000 | 80 | 10 |
| Cloudy day, noon, sunlight | 32,000 | 63 | 8 |
| Sunny day, 3pm, sunlight | 35,000 | 57 | 7 |
| Sunny day, 10am, sunlight | 65,000 | 31 | 5 |
| Sunny day, noon, sunlight | 100,000 | 20 | 3 |
| Snowy mountain, noon | 200,000 | 10 | 2 |

As described above, by setting the exposure time Tsec and the line number of lines to which the on-voltage is applied that are calculated based on the illuminance and the capacitance of the floating diffusion capacitor FD, the short exposure can be performed in the high brightness so that the image sensor 1 with the high image quality and high response characteristics can be provided.

In the image sensor 1 according to some example embodiments, the driving circuit 50 may move the photoelectric conversion ON region by one line in the −Y-axis direction in synchronization with the timing of scanning one pixel electrode line 41 in the −Y-axis direction as a read line (e.g., the timing of scanning the read line by one pixel electrode line). In an image sensor 1 according to some example embodiments, the driving circuit 50 moves a photoelectric conversion ON region by a plurality of lines (e.g., a first set of two or more pixel electrode lines) in the −Y-axis direction (e.g., in the first side of the second direction) in synchronization with the timing of scanning a plurality of (e.g., a second set of two or more) pixel electrode lines 41 in the −Y-axis direction as a plurality of read lines. An operation of 1EA/1Line is first described as in some example embodiments, including the above-described example embodiments, and operations of 1EA/2Line and 1EA/4Line according to some example embodiments are then described.

1EA/1Line

Figure 11:
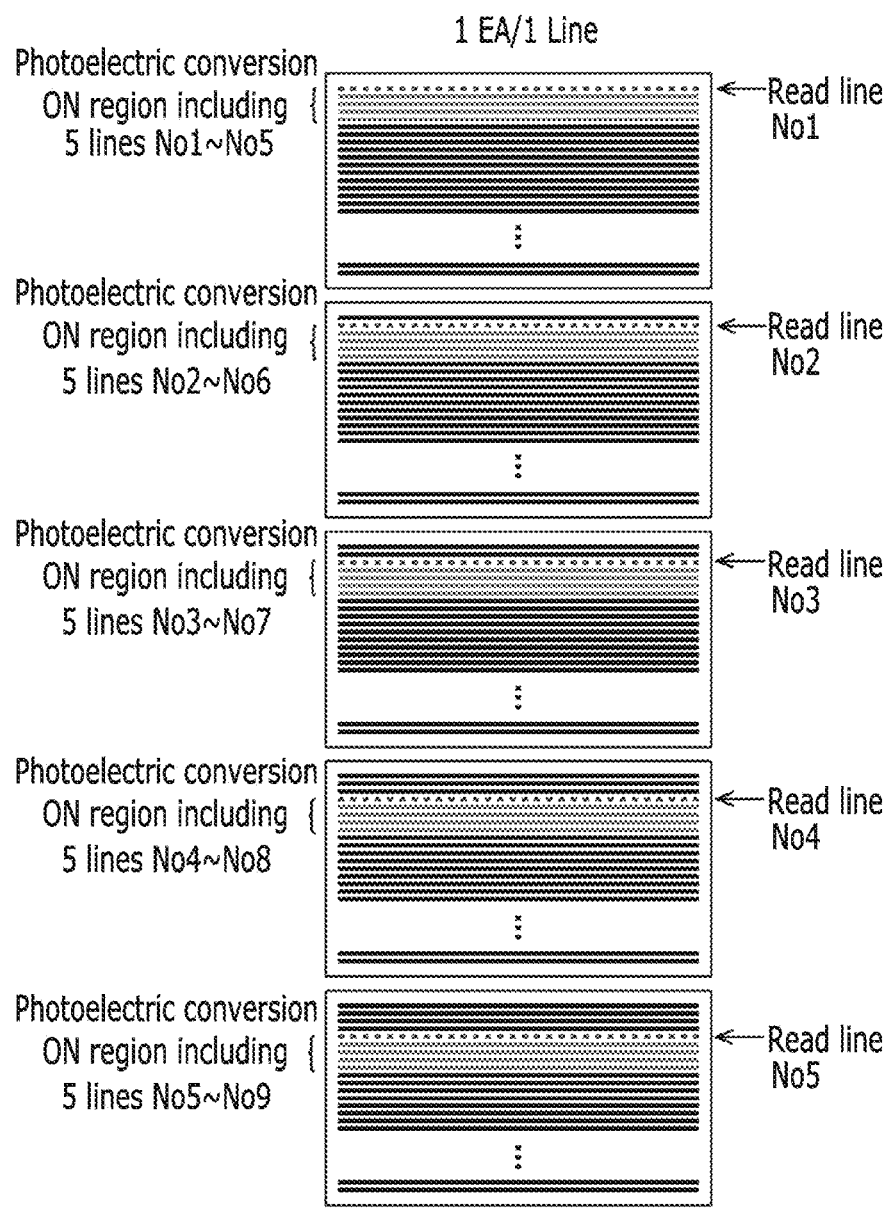
FIG. 11 is a diagram showing an operation of scanning a photoelectric conversion ON region by one line in a −Y-axis direction in synchronization with a timing of scanning a read line by one line in the −Y-axis direction in an image sensor according to some example embodiments.

FIG. 11 is a diagram showing an operation of scanning a photoelectric conversion ON region by one line in a −Y-axis direction in synchronization with a timing of scanning a read line by one line in the −Y-axis direction in an image sensor according to some example embodiments. Such an operation is referred to as "1EA/1Line". As shown in FIG. 11, a photoelectric conversion ON region includes five pixel electrode lines. In FIG. 11, a black bold line represents a pixel electrode line to which an off-voltage is applied, and a gray bold line represents a pixel electrode line to which an on-voltage is applied. A dotted line represents the read line. The lines are shown in the same way in FIG. 12 and FIG. 13.

A driving circuit (50 of FIG. 3) scans a read line in a −Y-axis direction to read pixel information from each pixel electrode. For example, the pixel information may be read from pixel electrode lines No1 to No5 shown in FIG. 11. In this case, the driving circuit 50 scans a photoelectric conversion ON region by one line in the −Y-axis direction in synchronization with the timing of scanning the read line by one line in the −Y-axis direction.

For example, when the read line is the pixel electrode line No1, the photoelectric conversion ON region includes the pixel electrode lines No1 to No5. When the pixel electrode line No2 becomes the read line by scanning the read line by one line, the photoelectric conversion ON region includes the pixel electrode lines No2 to No6. Similarly, when the pixel electrode lines No3, No4, or No5 become the read line by scanning the read line by one line, the photoelectric conversion ON region includes the pixel electrode lines No3 to No7, No4 to No8, or No5 to No9.

1EA/2Line

Figure 12:
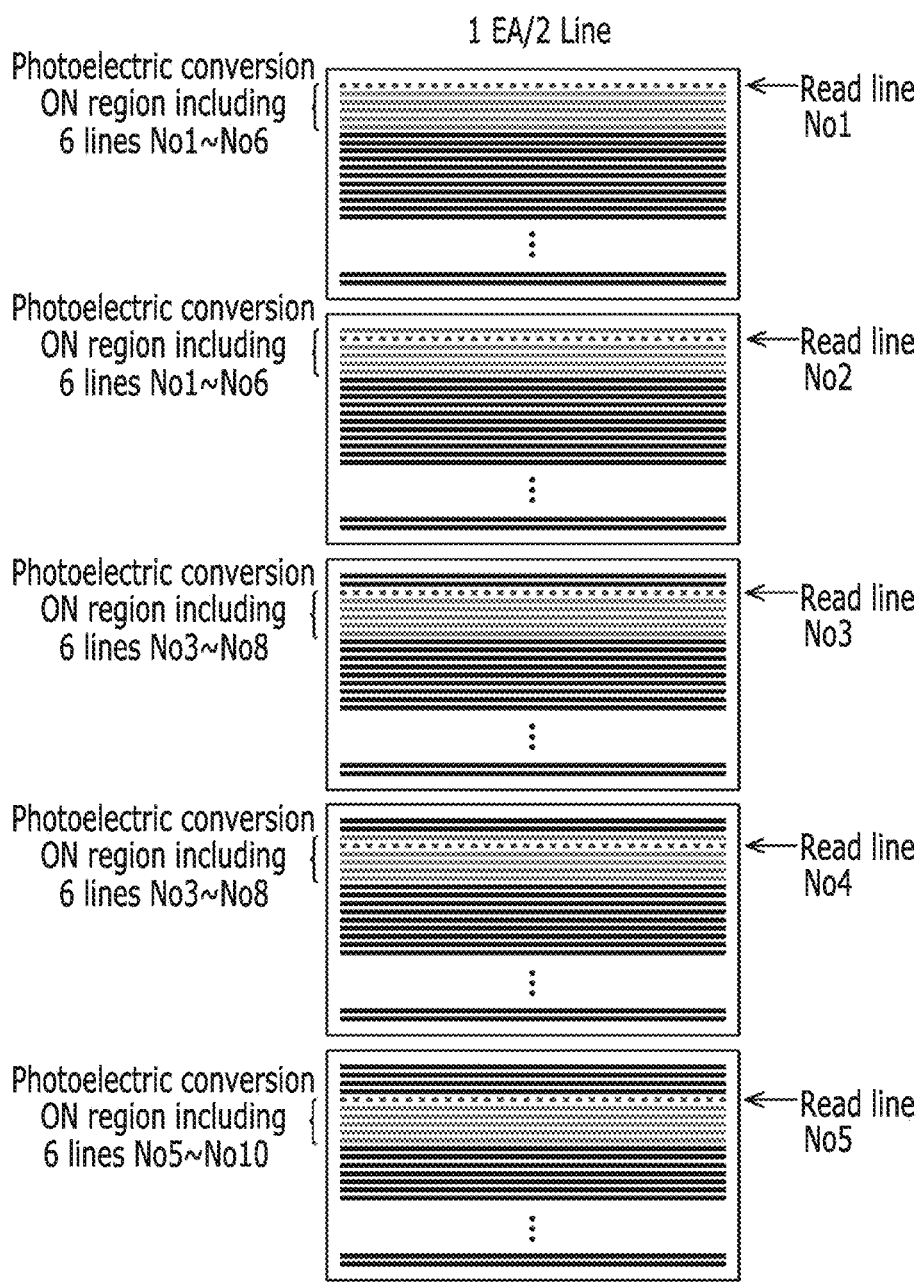
FIG. 12 is a drawing showing an operation of scanning a photoelectric conversion ON region including six pixel electrode lines by two lines in a −Y-axis direction in synchronization with a timing of scanning a read line by one line two times in the −Y-axis direction in an image sensor according to some example embodiments.

FIG. 12 is a drawing showing an operation of scanning a photoelectric conversion ON region including six pixel electrode lines by two lines in a −Y-axis direction in synchronization with a timing of scanning a read line by one line two times in the −Y-axis direction in an image sensor according to some example embodiments. Such an operation is referred to as "1EA/2Line". As shown in FIG. 12, a photoelectric conversion ON region includes six pixel electrode lines.

A driving circuit (50 of FIG. 3) scans a read line in a −Y-axis direction to read pixel information from each pixel electrode. For example, the pixel information may be read from pixel electrode lines No1 to No5 shown in FIG. 12. In this case, the driving circuit 50 scans the photoelectric conversion ON region by two lines in the −Y-axis direction in synchronization with the timing of scanning the read line two times in the −Y-axis direction.

For example, when the read line is the pixel electrode line No1, the photoelectric conversion ON region includes the pixel electrode line No1 to No6. However, in the case of the 1EA/2Line operation, even when the read line is scanned by one line so that the pixel electrode line 41 of No2 becomes the read line, the photoelectric conversion ON region includes the pixel electrode line No1 to No6. When the read line is further scanned by one line so that the pixel electrode line No3 becomes the read line, the photoelectric conversion ON region moves by two lines in the −Y-axis direction to include the pixel electrode lines No3 to No8.

Next, when the read line is scanned by one line so that the pixel electrode line 41 of No4 becomes the read line, the photoelectric conversion ON region includes the pixel electrode lines 41 of No3 to No8. When the read line is further scanned by one line so that the pixel electrode line No5 becomes the read line, the photoelectric conversion ON region moves by two lines in the −Y-axis direction to include the pixel electrode lines No5 to No10.

As described above, in the case of 1EA/2Line operation, the driving circuit 50 scans the photoelectric conversion ON region by two lines at the timing of scanning the read line two times.

1EA/4 Line

Figure 13:
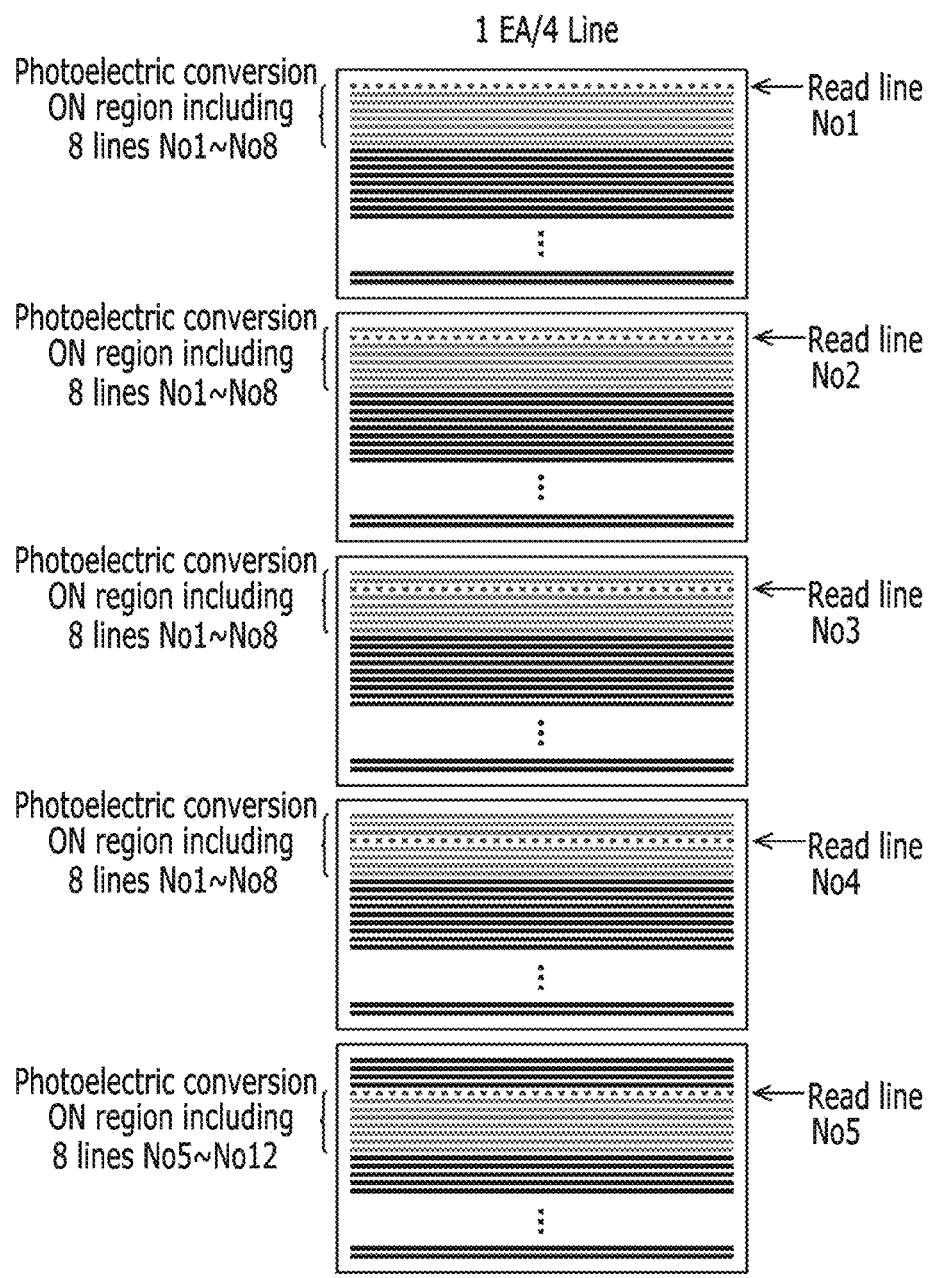
FIG. 13 is a drawing showing an operation of scanning a photoelectric conversion ON region including eight pixel electrode lines by four lines in a −Y-axis direction in synchronization with a timing of scanning a read line by one line four times in the −Y-axis direction in an image sensor according to yet some example embodiments.
Figure 14A:
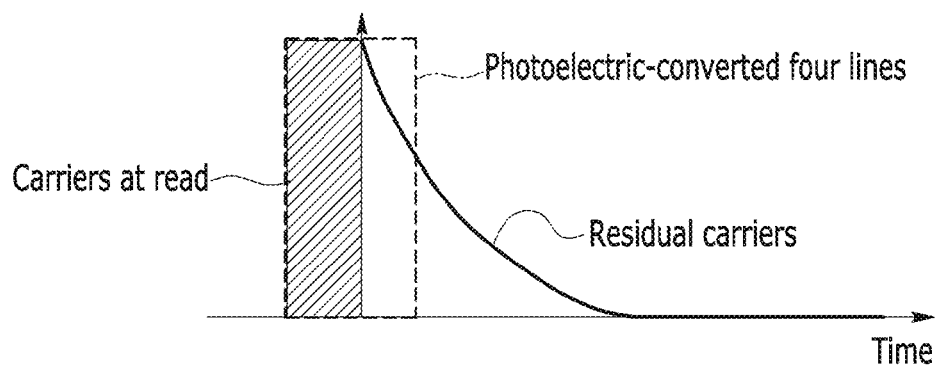
FIG. 14A, FIG. 14B, FIG. 14C, and FIG. 14D are graphs showing residual carriers and a photoelectric conversion ON region in a case of 1EA/4Line in an image sensor according to some example embodiments, wherein a horizontal axis represents a time, and a vertical axis represents the number of residual carriers.
Figure 14B:
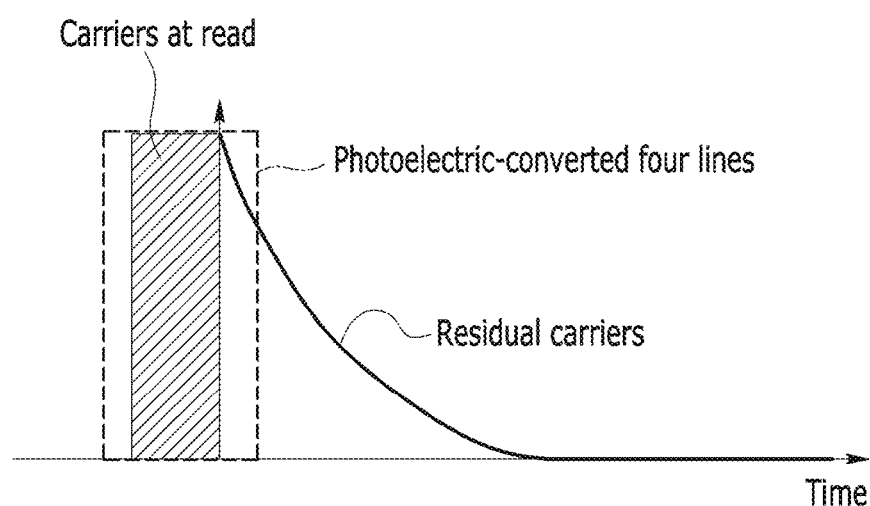
Figure 14C:
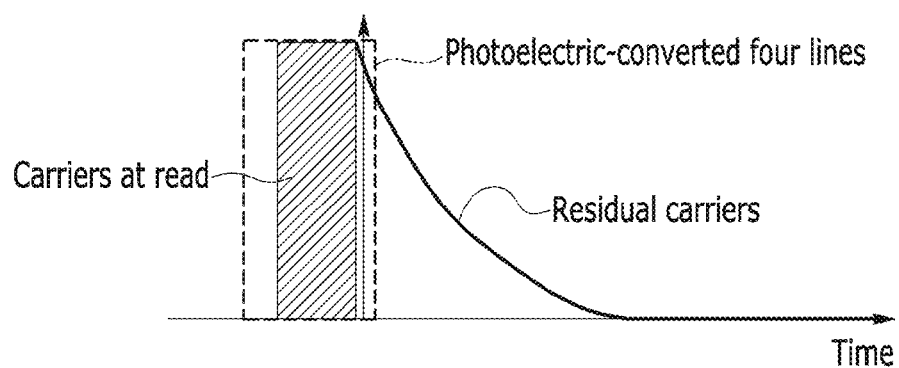
Figure 14D:
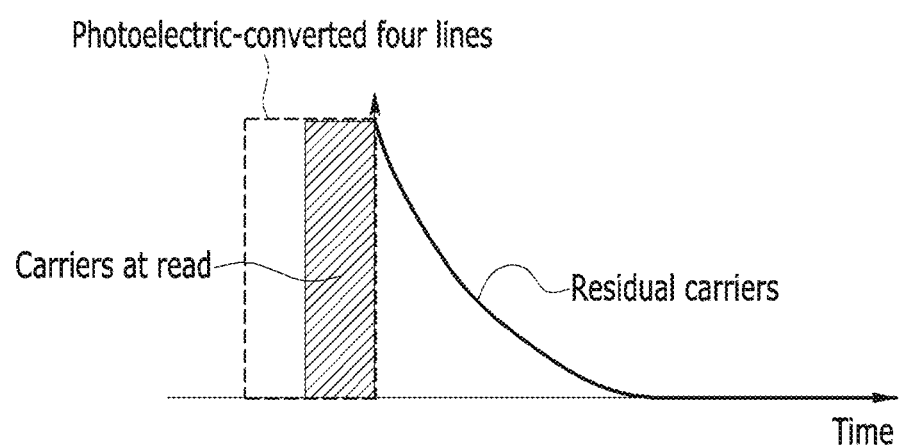
Figure 15A:
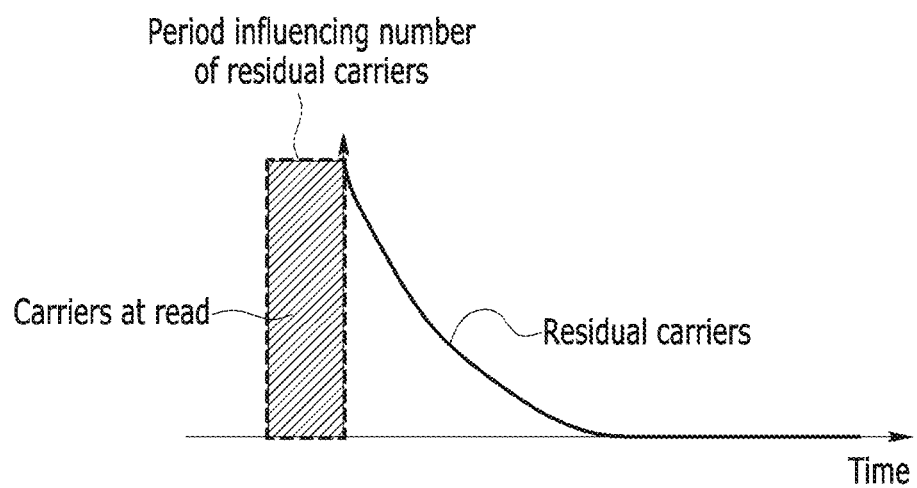
FIG. 15A, FIG. 15B, FIG. 15C, and FIG. 15D are graphs showing residual carriers and a period influencing the number of residual carriers in a case of 1EA/4Line in an image sensor according to some example embodiments, wherein a horizontal axis represents a time, and a vertical axis represents the number of residual carriers.
Figure 15B:
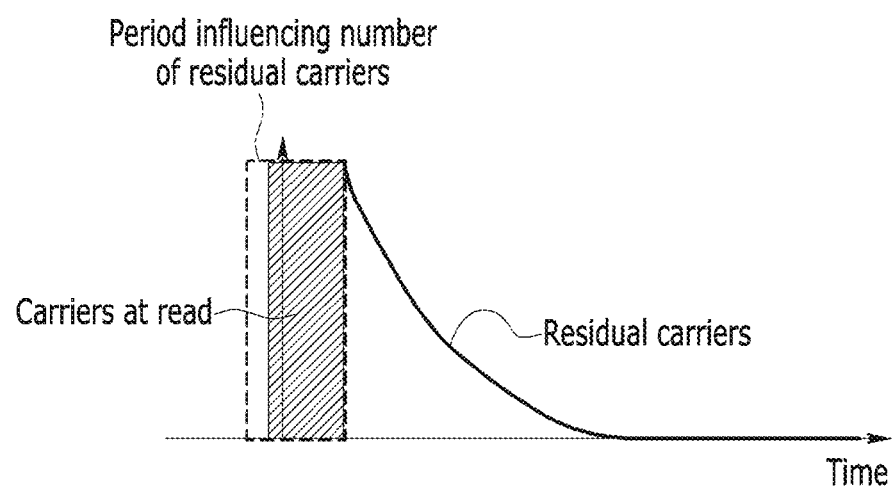
Figure 15C:
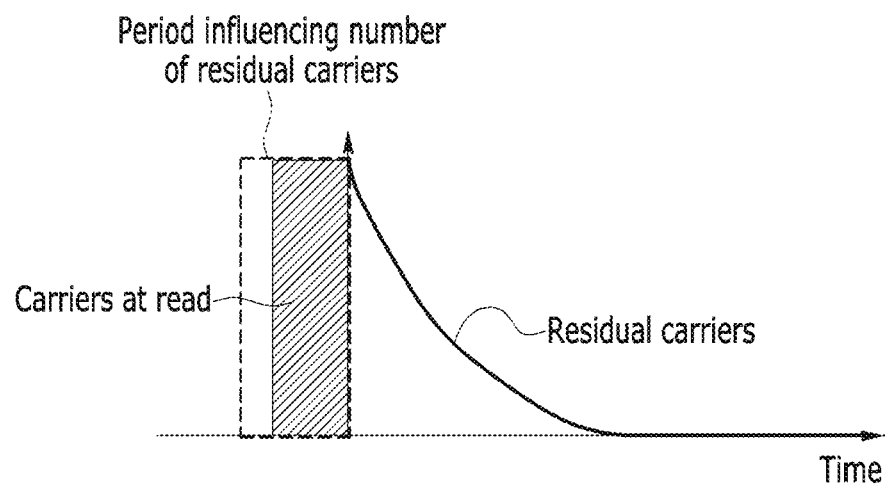
Figure 15D:
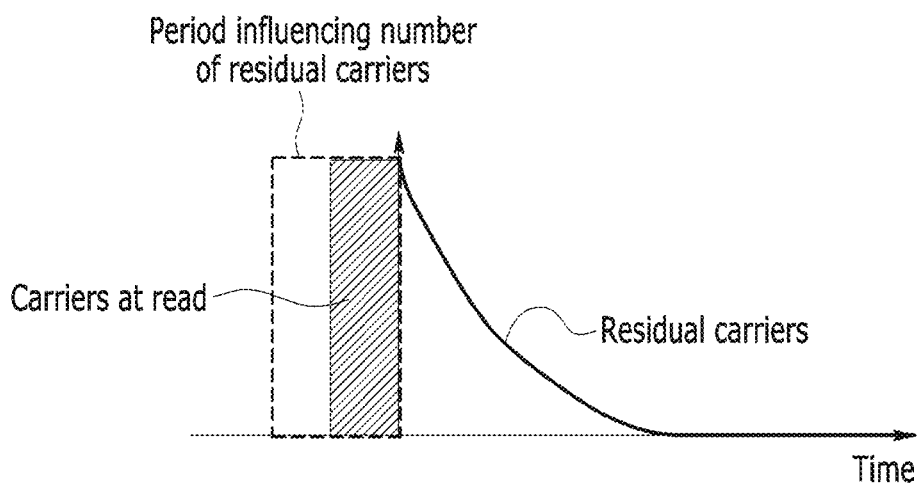

FIG. 13 is a drawing showing an operation of scanning a photoelectric conversion ON region including eight pixel electrode lines by four lines in a −Y-axis direction in synchronization with a timing of scanning a read line by one line four times in the −Y-axis direction in an image sensor according to yet some example embodiments. Such an operation is referred to as "1EA/4Line". As shown in FIG. 13, a photoelectric conversion ON region includes eight pixel electrode lines.

A driving circuit (50 of FIG. 3) scans a read line in a −Y-axis direction to read pixel information from each pixel electrode. For example, the pixel information may be read from pixel electrode lines No1 to No5 shown in FIG. 13. In this case, the driving circuit 50 scans the photoelectric conversion ON region by four lines in the −Y-axis direction in synchronization with the timing of scanning the read line four times in the −Y-axis direction.

For example, when the read line is the pixel electrode line No1, the photoelectric conversion ON region includes the pixel electrode line No1 to No8. Even when the read line is scanned by one line so that the pixel electrode line 41 of No2 becomes the read line, the photoelectric conversion ON region includes the pixel electrode line No1 to No8. Even when the read line is further scanned by one line so that the pixel electrode line No3 becomes the read line, the photoelectric conversion ON region includes the pixel electrode line No1 to No8. Additionally, even when the read line is further scanned by one line so that the pixel electrode line No4 becomes the read line, the photoelectric conversion ON region includes the pixel electrode line No1 to No8. When the read line is further scanned by one line so that the pixel electrode line No5 becomes the read line, the photoelectric conversion ON region moves by four lines in the −Y-axis direction to include the pixel electrode lines No5 to No12.

As described above, in the case of the 1EA/4Line operation, the driving circuit 50 scans the photoelectric conversion ON region by four lines at the timing of scanning the read line four times.

In the 1EA/2Line and 1EA/4Line operations according to some example embodiments, the driving circuit 50 scans the photoelectric conversion ON region by a plurality of lines in the −Y-axis direction in synchronization with the timing of scanning the read line a plurality of times in the −Y-axis direction. By setting the pixel electrode lines 41 to be synchronized with the scanning timing of the read line as a plurality of lines, the number of bias circuits 52 to be mounted can be reduced so that the circuit scale can be reduced.

FIG. 14A, FIG. 14B, FIG. 14C, and FIG. 14D are graphs showing residual carriers and a photoelectric conversion ON region in a case of 1EA/4Line in an image sensor according to some example embodiments, wherein a horizontal axis represents a time, and a vertical axis represents the number of residual carriers. FIG. 14A, FIG. 14B, FIG. 14C, and FIG. 14D each show the number of residual carriers in the pixel electrode lines No1 to No4. FIG. 15A, FIG. 15B, FIG. 15C, and FIG. 15D are graphs showing residual carriers and a period influencing the number of residual carriers in a case of 1EA/4Line in an image sensor according to some example embodiments, wherein a horizontal axis represents a time, and a vertical axis represents the number of residual carriers. FIG. 15A, FIG. 15B, FIG. 15C and FIG. 15D each show the number of residual carriers in the pixel electrode lines No1 to No4.

As shown in FIG. 13, in the case of 1EA/4Line, a photoelectric conversion ON region does not move while the pixel electrode lines No1 to No4 are scanned as a read line. As shown in FIG. 14A, FIG. 14B, FIG. 14C, and FIG. 14D, after pixel information is read, residual carriers of each pixel electrode line in the photoelectric conversion ON region are reduced.

As shown in FIG. 15A, FIG. 15B, FIG. 15C, and FIG. 15D, in the case of 1EA/4Line, a period during which the pixel electrode line No4 influences the residual carriers is longer than that of the pixel electrode line No1. Therefore, the influence of residual carriers in 1EA/4Line is greater than that in 1EA/1Line. However, the influence is remarkably little compared to a comparative example in which an on-voltage is applied to entire pixel electrode lines. Therefore, the effect of reducing the circuit scale in some example embodiments is more advantageous than the influence of residual carriers.

Table 2 shows minimum and maximum values of a photoelectric conversion period influencing the number of residual carriers when scanning a photoelectric conversion ON region by a plurality of lines in a −Y-axis direction in synchronization with a timing of scanning a read line a plurality of times in the −Y-axis direction in an image sensor according to some example embodiments.

As shown in Table 2, in a sunlight scene at 10 am on a cloudy day, the illuminance, the exposure time Tsec, and the line number at 60 fps are 25000 1x, 80 μs, and 10 lines, respectively. When a mounting ratio P of bias circuits (52 of FIG. 3), i.e., a line number P of pixel electrode lines to which an on-voltage is applied is set to any one of two, four, and eight, a minimum value of a photoelectric conversion period influencing the number of residual carriers is ten lines. When the line number P of pixel electrode lines to which the on-voltage is applied is set to two, four, and eight, respectively, maximum values of the photoelectric conversion period influencing the number of residual carriers are eleven lines, thirteen lines, and seventeen lines, respectively. Here, the minimum value is equal to the line number L at 60 fps, and the maximum value is equal to (L+P−1).

In the sunlight scene at noon on the cloudy day, the illuminance, the exposure time Tsec, and the line number at 60 fps are 32000 1x, 63 μs, and 8 lines, respectively. When the mounting ratio P of bias circuits 52 is set to any one of two lines, four lines, and eight lines, the minimum value of the photoelectric conversion period influencing the number of residual carriers is ten lines. When the line number P of pixel electrode lines to which the on-voltage is applied is set to two, four, and eight, respectively, the maximum values of the photoelectric conversion period influencing the number of residual carriers are nine lines, eleven lines, and fifteen lines, respectively.

In a scene of a snowy mountain at noon, the illuminance, the exposure time Tsec, and the line number at 60 fps are 200000 lx, 10 μs, and 2 lines, respectively. When the

TABLE 2

| Scene | Illuminance (lx) | Exposure time Tsec (μs) | Line number L at 60 fps (12 Mpix image sensor) | Mounting ratio P of bias circuit (Line number) | Minimum value of photoelectric conversion period influencing number of residual carriers (Line number) | Maximum value of photoelectric conversion period influencing number of residual carriers (Line number) |
|---|---|---|---|---|---|---|
| Cloudy day, 10am, sunlight | 25,000 | 80 | 10 | 2 | 10 | 11 |
|  |  |  |  | 4 | 10 | 13 |
|  |  |  |  | 8 | 10 | 17 |
| Cloudy day, noon, sunlight | 32,000 | 63 | 8 | 2 | 8 | 9 |
|  |  |  |  | 4 | 8 | 11 |
|  |  |  |  | 8 | 8 | 15 |
| Sunny day, 3pm, sunlight | 35,000 | 57 | 7 | 2 | 7 | 8 |
|  |  |  |  | 4 | 7 | 10 |
|  |  |  |  | 8 | 7 | 14 |
| Sunny day, 10am, sunlight | 65,000 | 31 | 5 | 2 | 4 | 5 |
|  |  |  |  | 4 | 4 | 7 |
|  |  |  |  | 8 | 4 | 11 |
| Sunny day, noon, sunlight | 100,000 | 20 | 3 | 2 | 3 | 4 |
|  |  |  |  | 4 | 3 | 6 |
|  |  |  |  | 8 | 3 | 10 |
| Snowy mountain, noon | 200,000 | 10 | 2 | 2 | 2 | 3 |
|  |  |  |  | 4 | 2 | 5 |
|  |  |  |  | 8 | 2 | 9 |

In the sunlight scene at 3 pm on a sunny day, the illuminance, the exposure time Tsec, and the line number at 60 fps are 35000 lx, 57 μs, and 7 lines, respectively. When the mounting ratio P of bias circuits 52 is set to any one of two lines, four lines, and eight lines, the minimum value of the photoelectric conversion period influencing the number of residual carriers is seven lines. When the line number P of pixel electrode lines to which the on-voltage is applied is set to two, four, and eight, respectively, the maximum values of the photoelectric conversion period influencing the number of residual carriers are eight lines, ten lines, and fourteen lines, respectively.

In the sunlight scene at 10 am on the sunny day, the illuminance, the exposure time Tsec, and the line number at 60 fps are 65000 lx, 31 μs, and 4 lines, respectively. When the mounting ratio P of bias circuits 52 is set to any one of two lines, four lines, and eight lines, the minimum value of the photoelectric conversion period influencing the number of residual carriers is four lines. When the line number P of pixel electrode lines to which the on-voltage is applied is set to two, four, and eight, respectively, the maximum values of the photoelectric conversion period influencing the number of residual carriers are five lines, seven lines, and eleven lines, respectively.

In the sunlight scene at noon on the sunny day, the illuminance, the exposure time Tsec, and the line number at 60 fps are 100000 lx, 20 μs, and 3 lines, respectively. When the mounting ratio P of bias circuits 52 is set to any one of two lines, four lines, and eight lines, the minimum value of the photoelectric conversion period influencing the number of residual carriers is three lines. When the line number P of pixel electrode lines to which the on-voltage is applied is set to two, four, and eight, respectively, the maximum values of the photoelectric conversion period influencing the number of residual carriers are four lines, six lines, and ten lines, respectively.

mounting ratio P of bias circuits 52 is set to any one of two lines, four lines, and eight lines, the minimum value of the photoelectric conversion period influencing the number of residual carriers is two lines. When the line number P of pixel electrode lines to which the on-voltage is applied is set to two, four, and eight, respectively, the maximum values of the photoelectric conversion period influencing the number of residual carriers are three lines, five lines, and nine lines, respectively.

As such, in a scene where the brightness is relatively low, such as the sunlight at noon on the cloudy day, even if the mounting ratio of the bias circuits 52 is increased, the influence of residual carriers can be suppressed so that circuit scale can be reduced. Further, in a scene where the brightness is relatively high, such as the snowy mountain at noon, the mounting ratio of the bias circuits 52 cannot be increased compared to the scene where the brightness is relatively low, such as the sunlight at noon on the cloudy day. However, for example, the mounting ratio can be set to two lines in an image sensor of 60 fps. Therefore, the circuit scale can be reduced.

Next, effects according to various example embodiments are described. In an image sensor according to some example embodiments, a driving circuit may apply an on-voltage to a pixel electrode line in a photoelectric conversion ON region and an off-voltage to a pixel electrode line other than the photoelectric conversion ON region. Since the on-voltage is not applied to the pixel electrode line that does not require exposure, the number of carriers remaining in an organic photoelectric film can be reduced. Accordingly, it is possible to provide a high image quality and improve response characteristics.

The driving circuit 50 may apply the on-voltage to a pixel electrode line arranged in a scanning direction from the read line. Therefore, the carriers can be accumulated in advance until they are saturated beforehand so that the image quality can be improved.

The number of the pixel electrode lines included in the photoelectric conversion ON region may be set based on an exposure time during which the on-voltage is applied. The exposure time Tsec may be set depending on illuminance of light irradiated to the organic photoelectric film. Therefore, the on-voltage can be applied to the pixel electrode lines 41 having an appropriate line number during an appropriate exposure time Tsec, so that the image quality can be improved.

In some example embodiments, the number of pixel electrode lines included in the photoelectric conversion ON region may be set depending on illuminance such as a cloudy day, a sunny day, or a snowy mountain. Therefore, the scale of the driving circuit can be reduced while suppressing the influence of the residual carriers.

Although the example embodiments of the present inventive concepts have been described in detail above, the scope of the present inventive concepts is not limited thereto, and various modifications and improvements of those skilled in the art using the basic concept of the present inventive concepts defined in the following claims are also provided. It belongs to the scope of rights.

What is claimed is:

1. An image sensor, comprising:
    a substrate;
    an organic photoelectric film on the substrate, the organic photoelectric film configured to perform photoelectric conversion of incident light;
    a plurality of pixel electrodes between the substrate and the organic photoelectric film, the plurality of pixel electrodes arranged, in a matrix form, in a first direction and a second direction intersecting the first direction, the plurality of pixel electrodes defining a plurality of pixel electrode lines, each pixel electrode line of the plurality of pixel electrode lines including a separate linear sequential pattern of pixel electrodes, each linear sequential pattern extending in the first direction; and
    a driving circuit on the substrate, the driving circuit configured to
        read pixel information from each pixel electrode of at least one pixel electrode line among the plurality of pixel electrode lines, the at least one pixel electrode line being a read line, and
        apply, to one or more pixel electrode lines of the plurality of pixel electrode lines, a particular voltage that is
            an on-voltage associated with performing the photoelectric conversion, or
            an off-voltage associated with stopping the photoelectric conversion,
        wherein the driving circuit is configured to scan a photoelectric conversion ON region including a first pixel electrode line, to which the on-voltage is applied among the plurality of pixel electrode lines, in a first side of the second direction in synchronization with a timing of scanning the read line, among the plurality of pixel electrode lines from which the pixel information is read in the first side of the second direction, and
        wherein the driving circuit is configured to apply the off-voltage to a second pixel electrode line that is external to the photoelectric conversion ON region among the plurality of pixel electrode lines.

2. The image sensor of claim 1, wherein the second pixel electrode line is spaced apart from the read line in a second side of the second direction, the second side of the second direction being opposite to the first side of the second direction.

3. The image sensor of claim 1, wherein the photoelectric conversion ON region includes two or more pixel electrode lines of the plurality of pixel electrode lines.

4. The image sensor of claim 3, wherein the photoelectric conversion ON region includes the read line and a separate pixel electrode line that is spaced apart from the read line in the first side of the second direction.

5. The image sensor of claim 4, wherein a quantity of pixel electrode lines, of the two or more pixel electrode lines, in the photoelectric conversion ON region is set based on an exposure time during which the on-voltage is applied.

6. The image sensor of claim 3, wherein the driving circuit is configured to move the photoelectric conversion ON region by a first set of two or more pixel electrode lines in the first side of the second direction in synchronization with scanning a second set of two or more pixel electrode lines as a plurality of read lines.

7. The image sensor of claim 1, wherein the driving circuit is configured to move the photoelectric conversion ON region by one pixel electrode line in the first side in synchronization with scanning the read line by one particular pixel electrode line.

8. The image sensor of claim 1, wherein
    the driving circuit includes a floating diffusion capacitor that is configured to accumulate carriers as the pixel information, and
    an exposure time during which the on-voltage is applied is set based on a capacitance of the floating diffusion capacitor.

9. The image sensor of claim 8, wherein the exposure time is set further based on illuminance of light incident on the organic photoelectric film.

10. The image sensor of claim 1, wherein the driving circuit comprises:
    a read circuit on each pixel electrode of the plurality of pixel electrodes, each read circuit configured to read the pixel information from a corresponding pixel electrode; and
    a bias circuit on each pixel electrode line of the plurality of pixel electrode lines, each bias circuit configured to apply the on-voltage or the off-voltage to each pixel electrode of a corresponding pixel electrode line.

11. The image sensor of claim 10, further comprising:
    a photoelectric film electrode on the organic photoelectric film,
    wherein the bias circuit is configured to
        apply the on-voltage to each pixel electrode of the corresponding pixel electrode line so that the photoelectric film electrode has a positive potential compared to each pixel electrode of the corresponding pixel electrode line, and
        apply the off-voltage to each pixel electrode of the corresponding pixel electrode line so that each pixel electrode of the corresponding pixel electrode line has a positive potential compared to the photoelectric film electrode.

12. A driving method of an image sensor, the image sensor including a substrate, an organic photoelectric film on the substrate and configured to perform photoelectric conversion of incident light, and a plurality of pixel electrode lines between the substrate and the organic photoelectric film, the plurality of pixel electrode lines arranged in a first direction, each pixel electrode line of the plurality of pixel electrode lines including a separate linear sequential pattern of pixel electrodes, each linear sequential pattern extending in a second direction intersecting the first direction, the method comprising:

scanning a pixel electrode line, of the plurality of pixel electrode lines, that is a read line, from which pixel information is read among the plurality of pixel electrode lines, in a first side of the first direction;

moving a photoelectric conversion ON region including a separate pixel electrode line, to which an on-voltage associated with performing the photoelectric conversion is applied among the pixel electrode lines, in the first side of the first direction in synchronization with a timing of scanning the read line in the first side of the first direction; and applying an off-voltage associated with stopping the photoelectric conversion to at least one pixel electrode line that is external to the photoelectric conversion ON region among the plurality of pixel electrode lines.

13. The method of claim 12, wherein the photoelectric conversion ON region includes the read line and at least one separate pixel electrode line spaced apart from the read line in the first side of the first direction.

14. The method of claim 12, wherein a quantity of pixel electrode lines in the photoelectric conversion ON region is set based on an exposure time during which the on-voltage is applied.

15. An image sensor, comprising:
a substrate;
an organic photoelectric film on the substrate, the organic photoelectric film configured to perform photoelectric conversion of incident light;
a plurality of pixel electrode lines between the substrate and the organic photoelectric film, the plurality of pixel electrode lines arranged in a first direction, each pixel electrode line of the plurality of pixel electrode lines including a separate linear sequential pattern of pixel electrodes, each linear sequential pattern extending in a second direction intersecting the first direction; and
a driving circuit configured to
scan a pixel electrode line, of the plurality of pixel electrode lines, that is a read line from which pixel information is read among the plurality of pixel electrode lines in a first side of the first direction to read pixel information from one or more pixel electrodes in the read line,
move a photoelectric conversion ON region including a separate pixel electrode line, to which an on-voltage associated with performing the photoelectric conversion is applied among the plurality of pixel electrode lines, in the first side of the first direction in synchronization with a timing of scanning the read line in the first side of the first direction, and
apply an off-voltage associated with stopping the photoelectric conversion to at least one pixel electrode line that is external to the photoelectric conversion ON region among the plurality of pixel electrode lines.

16. The image sensor of claim 15, wherein the photoelectric conversion ON region includes the read line and at least one separate pixel electrode line spaced apart from the read line in the first side of the first direction.

17. The image sensor of claim 15, wherein a quantity of pixel electrode lines included in the photoelectric conversion ON region is set based on an exposure time during which the on-voltage is applied.

* * * * *